(12) United States Patent
Turner et al.

(10) Patent No.: US 12,034,423 B2
(45) Date of Patent: Jul. 9, 2024

(54) XBAR FRONTSIDE ETCH PROCESS USING POLYSILICON SACRIFICIAL LAYER

(71) Applicant: MURATA MANUFACTURING CO., LTD, Kyoto (JP)

(72) Inventors: Patrick Turner, San Bruno, CA (US); Ryo Wakabayashi, Santa Clara, CA (US)

(73) Assignee: MURATA MANUFACTURING CO., LTD, Nagaokakyo (JP)

( * ) Notice: Subject to any disclaimer, the term of this patent is extended or adjusted under 35 U.S.C. 154(b) by 794 days.

(21) Appl. No.: 17/116,971

(22) Filed: Dec. 9, 2020

(65) Prior Publication Data

US 2021/0119595 A1     Apr. 22, 2021

Related U.S. Application Data

(63) Continuation-in-part of application No. 16/913,417, filed on Jun. 26, 2020, now Pat. No. 10,911,021.

(Continued)

(51) Int. Cl.
    *H03H 3/02*      (2006.01)
    *H03H 9/02*      (2006.01)
    *H03H 9/205*     (2006.01)

(52) U.S. Cl.
    CPC .......... *H03H 3/02* (2013.01); *H03H 9/02015* (2013.01); *H03H 9/02228* (2013.01); *H03H 9/205* (2013.01)

(58) Field of Classification Search
    CPC .. H03H 3/02; H03H 9/02228; H03H 9/02992; H03H 9/25; H03H 2003/023
    See application file for complete search history.

(56) References Cited

U.S. PATENT DOCUMENTS 5,446,330 A    8/1995    Eda et al.
5,552,655 A    9/1996    Stokes et al.
(Continued)

FOREIGN PATENT DOCUMENTS

WO    2016017104         2/2016
WO    2018003273 A1      1/2018

OTHER PUBLICATIONS

T. Takai, H. Iwamoto, et al., "I.H.P.Saw Technology and its Application to Microacoustic Components (Invited). " 2017 IEEE International Ultrasonics Symposium, Sep. 6-9, 2017. pp.1-8.

(Continued)

*Primary Examiner* — Jeffrey T Carley
*Assistant Examiner* — Jose K Abraham
(74) *Attorney, Agent, or Firm* — ArentFox Schiff LLP

(57) ABSTRACT

An acoustic resonator is fabricated by etching a recess in a silicon thermal oxide (TOX) upper layer of a silicon substrate and filling the recess with sacrificial polysilicon. A surface of the silicon TOX layer and the sacrificial polysilicon-filled recess are planarized. A back surface of a single-crystal piezoelectric plate is bonded to the planarized surface of the silicon TOX layer. Openings are formed through the piezoelectric plate and an interdigital transducer (IDT) is formed on a front surface of the piezoelectric plate such that interleaved fingers of the IDT are disposed over the sacrificial polysilicon-filled recess. The sacrificial polysilicon is removed from the recess to form a cavity such that a portion of the piezoelectric plate forms a diaphragm spanning the cavity and the interleaved fingers of the IDT are disposed on the diaphragm.

15 Claims, 18 Drawing Sheets

Related U.S. Application Data

(60) Provisional application No. 63/019,755, filed on May 4, 2020, provisional application No. 62/904,407, filed on Sep. 23, 2019, provisional application No. 62/867,685, filed on Jun. 27, 2019.

(56) References Cited

U.S. PATENT DOCUMENTS

| | | | |
|---|---|---|---|
| 5,726,610 | A | 3/1998 | Allen et al. |
| 5,853,601 | A | 12/1998 | Krishaswamy et al. |
| 6,377,140 | B1 | 4/2002 | Ehara et al. |
| 6,516,503 | B1 | 2/2003 | Ikada et al. |
| 6,540,827 | B1 | 4/2003 | Levy et al. |
| 6,707,229 | B1 | 3/2004 | Martin |
| 6,710,514 | B2 | 3/2004 | Ikada et al. |
| 7,345,400 | B2 | 3/2008 | Nakao et al. |
| 7,463,118 | B2 | 12/2008 | Jacobsen |
| 7,535,152 | B2 | 5/2009 | Ogami et al. |
| 7,684,109 | B2 | 3/2010 | Godshalk et al. |
| 7,728,483 | B2 | 6/2010 | Tanaka |
| 7,868,519 | B2 | 1/2011 | Umeda |
| 7,941,103 | B2 | 5/2011 | Iwamoto et al. |
| 8,278,802 | B1 | 10/2012 | Lee et al. |
| 8,294,330 | B1 | 10/2012 | Abbott et al. |
| 8,344,815 | B2 | 1/2013 | Yamanaka |
| 8,816,567 | B2 | 8/2014 | Zuo et al. |
| 8,829,766 | B2 | 9/2014 | Milyutin et al. |
| 8,932,686 | B2 | 1/2015 | Hayakawa et al. |
| 9,093,979 | B2 | 7/2015 | Wang |
| 9,130,145 | B2 | 9/2015 | Martin et al. |
| 9,219,466 | B2 | 12/2015 | Meltaus et al. |
| 9,276,557 | B1 | 3/2016 | Nordquist et al. |
| 9,369,105 | B1 | 6/2016 | Li |
| 9,425,765 | B2 | 8/2016 | Rinaldi |
| 9,525,398 | B1 | 12/2016 | Olsson |
| 9,590,587 | B1 * | 3/2017 | Thalmayr ............... H03H 9/059 |
| 9,640,750 | B2 | 5/2017 | Nakanishi et al. |
| 9,748,923 | B2 | 8/2017 | Kando et al. |
| 9,762,202 | B2 | 9/2017 | Thalmayr et al. |
| 9,780,759 | B2 | 10/2017 | Kimura et al. |
| 9,837,984 | B2 | 12/2017 | Khlat et al. |
| 10,079,414 | B2 | 9/2018 | Guyette et al. |
| 10,187,039 | B2 | 1/2019 | Komatsu et al. |
| 10,200,013 | B2 | 2/2019 | Bower et al. |
| 10,211,806 | B2 | 2/2019 | Bhattacharjee |
| 10,284,176 | B1 | 5/2019 | Solal |
| 10,491,192 | B1 | 11/2019 | Plesski et al. |
| 10,601,392 | B2 | 3/2020 | Plesski et al. |
| 10,637,438 | B2 | 4/2020 | Garcia et al. |
| 10,644,674 | B2 | 5/2020 | Takamine |
| 10,756,697 | B2 | 8/2020 | Plesski et al. |
| 10,790,802 | B2 | 9/2020 | Yantchev et al. |
| 10,797,675 | B2 | 10/2020 | Plesski |
| 10,826,462 | B2 | 11/2020 | Plesski et al. |
| 10,868,512 | B2 | 12/2020 | Garcia et al. |
| 10,917,070 | B2 | 2/2021 | Plesski et al. |
| 11,539,344 | B2 * | 12/2022 | Kimura ............... H03H 9/1064 |
| 2002/0079986 | A1 | 6/2002 | Ruby et al. |
| 2002/0158714 | A1 | 10/2002 | Kaitila et al. |
| 2002/0189062 | A1 | 12/2002 | Lin et al. |
| 2003/0080831 | A1 | 5/2003 | Naumenko et al. |
| 2003/0199105 | A1 | 10/2003 | Kub et al. |
| 2004/0100164 | A1 | 5/2004 | Murata |
| 2004/0261250 | A1 | 12/2004 | Kadota et al. |
| 2005/0185026 | A1 | 8/2005 | Noguchi et al. |
| 2005/0218488 | A1 | 10/2005 | Matsuo |
| 2005/0264136 | A1 | 12/2005 | Tsutsumi et al. |
| 2006/0179642 | A1 | 8/2006 | Kawamura |
| 2007/0182510 | A1 | 8/2007 | Park |
| 2007/0188047 | A1 * | 8/2007 | Tanaka ............... H03H 9/02228 310/313 D |
| 2007/0194863 | A1 | 8/2007 | Shibata et al. |
| 2007/0267942 | A1 | 11/2007 | Matsumoto et al. |
| 2008/0246559 | A1 | 10/2008 | Ayazi |
| 2010/0064492 | A1 | 3/2010 | Tanaka |
| 2010/0123367 | A1 | 5/2010 | Tai et al. |
| 2011/0018389 | A1 | 1/2011 | Fukano et al. |
| 2011/0018654 | A1 | 1/2011 | Bradley et al. |
| 2011/0109196 | A1 | 5/2011 | Goto |
| 2011/0278993 | A1 | 11/2011 | Iwamoto |
| 2012/0286900 | A1 | 11/2012 | Kadota et al. |
| 2013/0234805 | A1 | 9/2013 | Takahashi |
| 2013/0271238 | A1 | 10/2013 | Onda |
| 2013/0278609 | A1 | 10/2013 | Stephanou et al. |
| 2013/0321100 | A1 | 12/2013 | Wang |
| 2014/0117815 | A1 | 5/2014 | Bi et al. |
| 2014/0130319 | A1 | 5/2014 | Iwamoto |
| 2014/0145556 | A1 | 5/2014 | Kadota |
| 2014/0151151 | A1 | 6/2014 | Reinhardt |
| 2014/0152145 | A1 * | 6/2014 | Kando ............... H03H 9/02574 29/25.35 |
| 2014/0173862 | A1 | 6/2014 | Kando et al. |
| 2014/0225684 | A1 | 8/2014 | Kando et al. |
| 2015/0042417 | A1 | 2/2015 | Onodera et al. |
| 2015/0319537 | A1 | 11/2015 | Perois et al. |
| 2015/0333730 | A1 | 11/2015 | Meltaus |
| 2016/0028367 | A1 | 1/2016 | Shealy |
| 2016/0036415 | A1 | 2/2016 | Ikeuchi |
| 2016/0182008 | A1 | 6/2016 | Bhattacharjee |
| 2016/0182009 | A1 | 6/2016 | Bhattacharjee |
| 2017/0063332 | A1 | 3/2017 | Gilbert et al. |
| 2017/0179928 | A1 | 6/2017 | Raihn et al. |
| 2017/0214381 | A1 | 7/2017 | Bhattacharjee |
| 2017/0214387 | A1 | 7/2017 | Burak et al. |
| 2017/0222617 | A1 | 8/2017 | Mizoguchi |
| 2017/0222622 | A1 | 8/2017 | Solal et al. |
| 2017/0250671 | A1 * | 8/2017 | Omura ............... H03H 9/02228 |
| 2017/0370791 | A1 | 12/2017 | Nakamura et al. |
| 2018/0005950 | A1 | 1/2018 | Watanabe |
| 2018/0026603 | A1 | 1/2018 | Iwamoto |
| 2018/0033952 | A1 | 2/2018 | Yamamoto |
| 2018/0062615 | A1 | 3/2018 | Kato et al. |
| 2018/0062617 | A1 | 3/2018 | Yun et al. |
| 2018/0123016 | A1 | 5/2018 | Gong et al. |
| 2018/0191322 | A1 | 7/2018 | Chang et al. |
| 2018/0337454 | A1 | 11/2018 | Han |
| 2019/0068164 | A1 | 2/2019 | Houlden et al. |
| 2019/0123721 | A1 | 4/2019 | Takamine |
| 2019/0131953 | A1 | 5/2019 | Gong |
| 2019/0158057 | A1 | 5/2019 | Jeong et al. |
| 2019/0245509 | A1 * | 8/2019 | Hurwitz ............. H03H 9/02031 |
| 2019/0273480 | A1 | 9/2019 | Lin |
| 2019/0341903 | A1 | 11/2019 | Kim |
| 2019/0348966 | A1 | 11/2019 | Campanella-Pineda |
| 2020/0036357 | A1 | 1/2020 | Mimura |
| 2020/0235719 | A1 | 7/2020 | Yantchev et al. |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate Mems Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

(56) References Cited

OTHER PUBLICATIONS

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi: 10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound2015, Bentham Science Publishers, pp. 16 (Year 2005).

Acoustic Properties of SolidsONDA Corporation592 Weddell Drive, Sunnyvale, CA 94089, Apr. 11, 2003, pp. 5 (Year 2003).

Bahreynl, B.Fabrication and Design of Resonant MicrodevicesAndrew William, Inc. 2018, NY (Year 2008).

Material Properties of Tibtech Innovations, © 2018 TIBTECH Innovations (Year 2018).

Buchanan "Ceramit Materials for Electronics" 3rd Edition, first published in 2004 by Marcel Dekker, Inc. pp. 496 (Year 2004). Jan. 2004.

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 2015.

Zou, Jie "High-Performance Aluminum Nitride Lamb Wave Resonators for RF Front-End Technology" University of California, Berkeley, Summer 2015, pp. 63 (Year 2015) Jan. 2015.

Santosh, G. , Surface acoustic wave devices on silicon using patterned and thin film ZnO, Ph.D. thesis, Feb. 2016, Indian Institute of technology Guwahati, Assam, India Feb. 2016.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

\* cited by examiner

XBAR FRONTSIDE ETCH PROCESS USING POLYSILICON SACRIFICIAL LAYER

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

The patent is a continuation-in-part of copending U.S. application Ser. No. 16/913,417 titled TRANSVERSELY-EXCITED FILM BULK ACOUSTIC RESONATOR WITH LATERAL ETCH STOP, filed Jun. 26, 2020, which claims priority from the following provisional patent applications: application 62/867,685, filed Jun. 27, 2019, entitled XBAR RESONATOR FABRICATION USING FRONT-SIDE CAVITY ETCH WITH LATERAL ETCH STOP; and application 62/904,407, filed Sep. 23, 2019, entitled XBAR FABRICATION PROCESS. This patent is related to application Ser. No. 16/230,443, filed Dec. 21, 2018, entitled TRANSVERSELY-EXCITED FILM BULK ACOUSTIC RESONATOR, now U.S. Pat. No. 10,491,192.

This patent claims priority to copending U.S. provisional patent application No. 63/019,755, titled XBAR FRONTSIDE ETCH PROCESS USING POLYSILICON SACRIFICIAL LAYER, filed May 4, 2020.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in patent U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

The Shear-Mode Film Bulk Acoustic Resonator (XBAR) is a new resonator structure for use in microwave filters. The XBAR is described in patent U.S. Pat. No. 10,491,291, titled TRANSVERSELY EXCITED FILM BULK ACOUSTIC RESONATOR, which is incorporated herein by reference in its entirety. An XBAR resonator comprises an interdigital transducer (IDT) formed on a thin floating layer, or diaphragm, of a piezoelectric material. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

Figure 1:
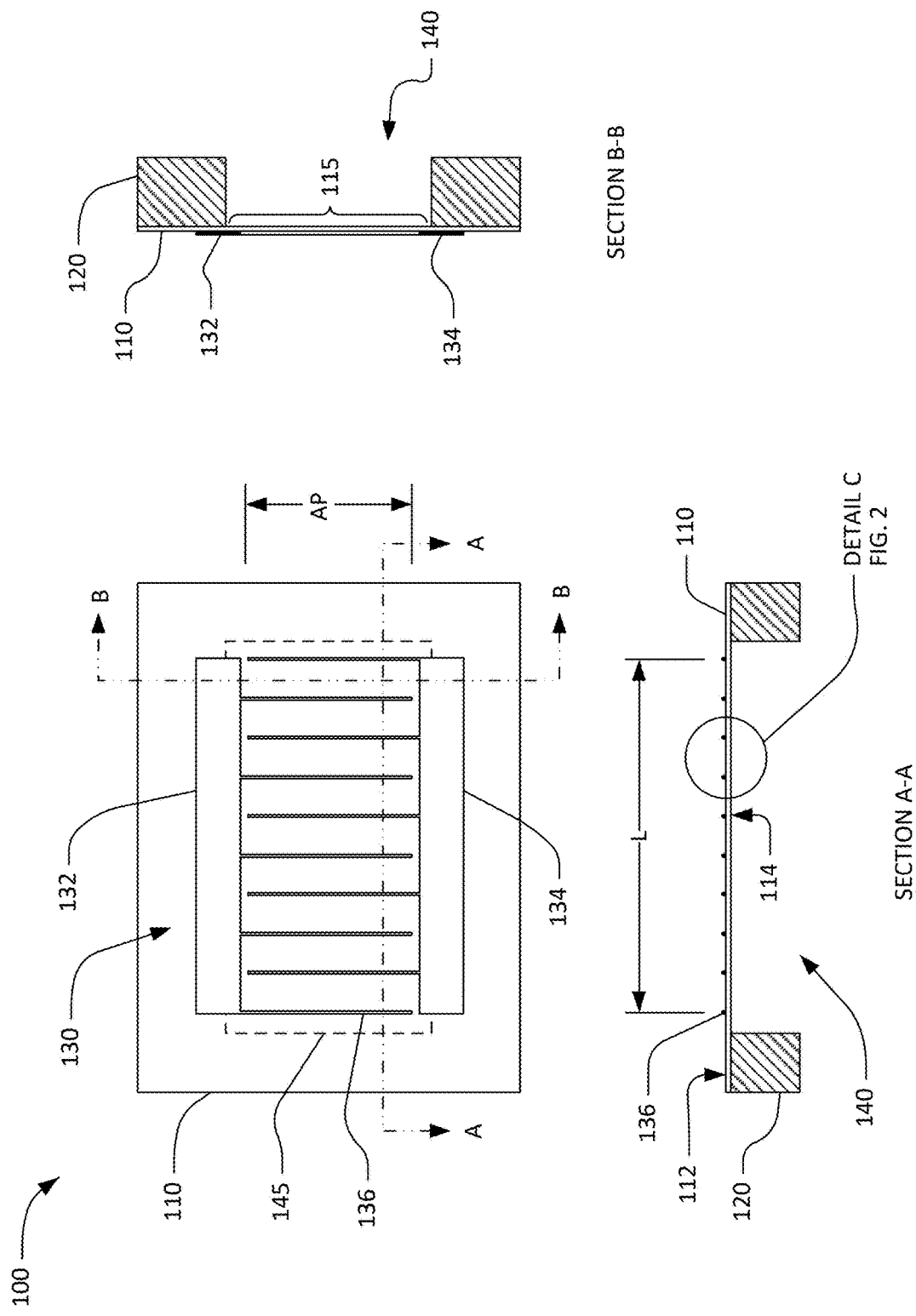
FIG. 1 includes a schematic plan view and two schematic cross-sectional views of a transversely-excited film bulk acoustic resonator (XBAR).

XBARs may be divided into two broad categories known as "the swimming pool option" (e.g., see FIGS. 3A-E) and the "backside etch option" (e.g., see FIG. 1). With the swimming pool option, the piezoelectric plate is attached to a substrate and the active portion of the piezoelectric plate floats over a cavity (the "swimming pool") formed in the substrate. With the backside etch option, the piezoelectric plate is attached to a substrate and the active portion of the piezoelectric plate floats over a void etched through the substrate from the back side (i.e. the side opposite the piezoelectric plate).

The following describes an improved fabrication technique to form swimming pool cavities beneath XBAR resonators.

The technique can include a frontside etch for fabricating XBAR resonators having a predefined diaphragm or membrane area formed by deposition of a predefined area and thickness of a sacrificial polycrystalline ("poly") silicon on a partially etched thermal oxide (TOX) layer, such as of a wafer having a top layer of silicon oxide.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate may be attached directly to the substrate, or may be attached to the substrate via one or more intermediate material layers. As shown in FIG. 1, the diaphragm 115 is contiguous with the rest of the piezoelectric plate 110 around all of a perimeter 145 of the cavity 140. In this context, "contiguous" means "continuously connected without any intervening item".

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120. "Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item".

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
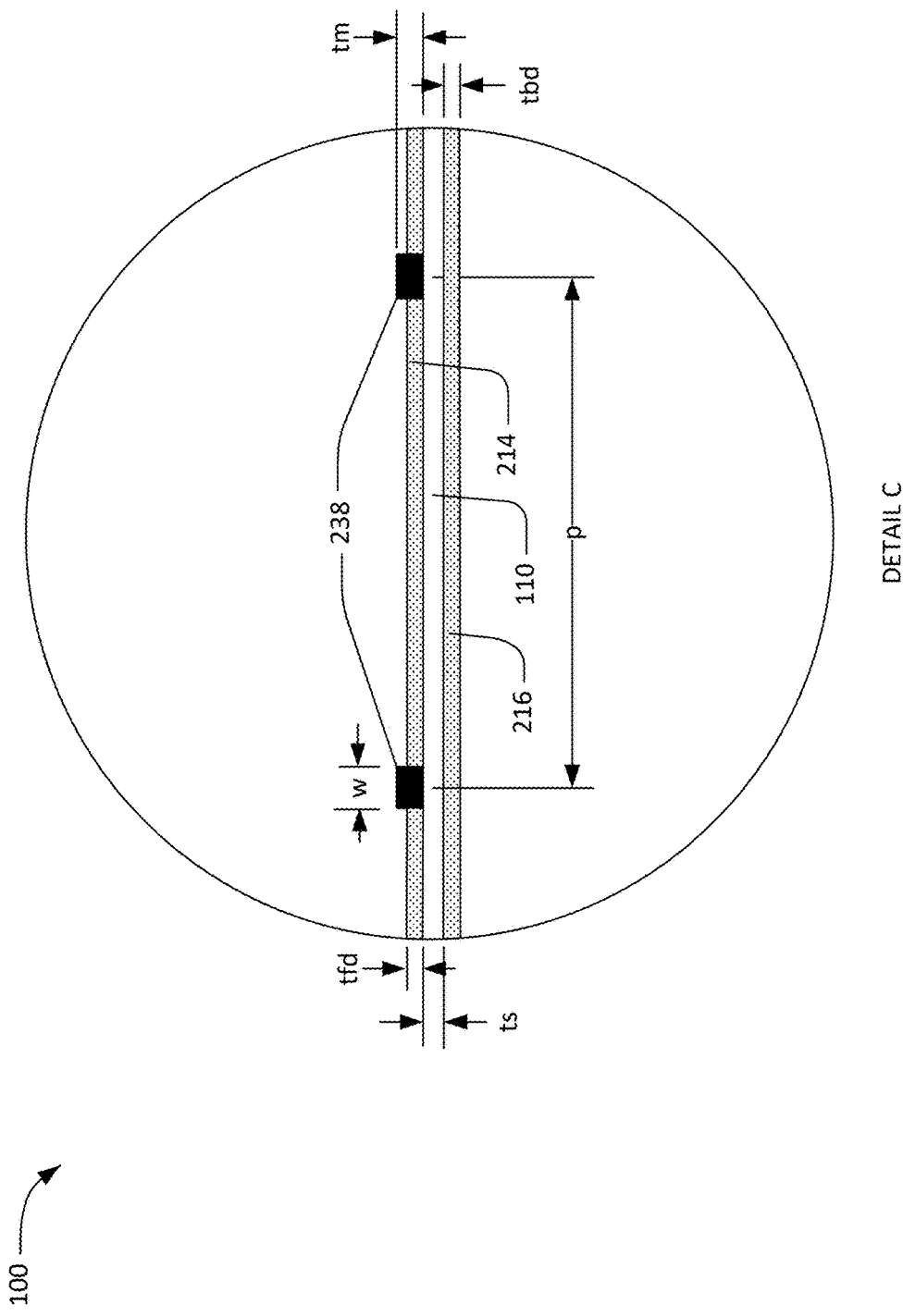
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuity external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal electrodes from water and chemical corrosion, particularly for power durability purposes. It may range from 10 to 100 nm. The passivation material may consist of multiple oxide and/or nitride coatings such as SiO2 and Si3N4 material.

The IDT fingers 238 may be aluminum or a substantially aluminum alloy, copper or a substantially copper alloy, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
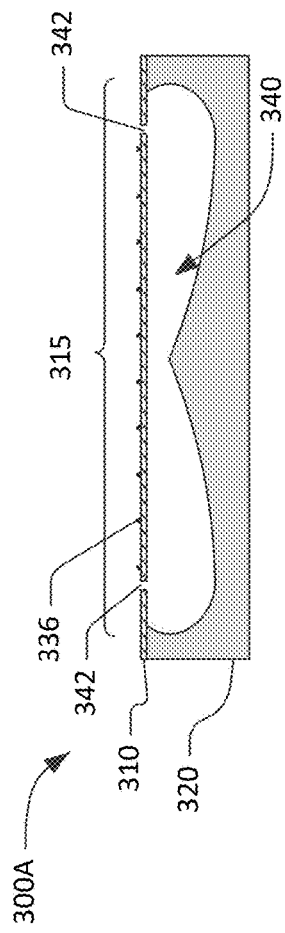
FIG. 3A is an alternative schematic cross-sectional view of an XBAR.
Figure 3B:
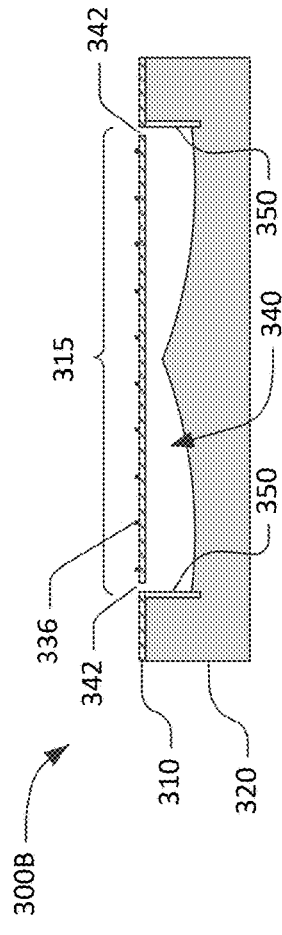
FIG. 3B is another alternative schematic cross-sectional view of an XBAR.
Figure 3C:
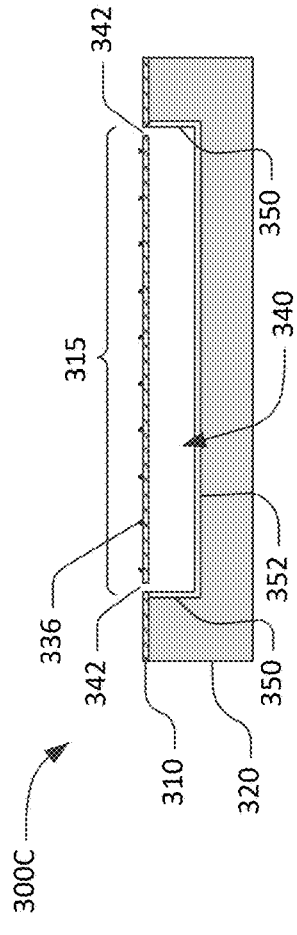
FIG. 3C is another alternative schematic cross-sectional view of an XBAR.

FIG. 3A, FIG. 3B, and FIG. 3C show alternative schematic cross-sectional views of XBAR devices 300A, 300B and 300C along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers, such as finger 336 similar to fingers 136, of an IDT are disposed on the diaphragm 315. The cavity 340 may be formed by etching the substrate 320 with a selective etchant that reaches the substrate through one or more openings 342 provided in the piezoelectric plate 310. The openings 342 may be circular holes or elongated slots or some other shape.

FIG. 3A illustrates problems that occur when the cavity is formed by etching the substrate 320 with a selective etchant that reaches the substrate through the openings 342 in the piezoelectric plate 310. The process used to form the cavity 340 will introduce a liquid or gaseous etchant via the openings 342. This etchant will etch isotropically, causing the cavity to expand in all directions from the openings 342. The resulting cavity will effectively increase the area of the diaphragm 315 beyond the area occupied by the IDT. Resistive and acoustic losses in the IDT generate heat in the diaphragm. Enlarging the diaphragm area beyond the area of the IDT increases the difficulty of removing the heat from the diaphragm. Further, the bottom of the cavity 340 will not be parallel to the piezoelectric plate 310. The deepest portions of the cavity will be proximate the openings 342 and the minimum depth of the cavity will occur near the center of the diaphragm 315.

The shape of the cavity in FIG. 3A is an artistic rendition of the potential problems with etching the cavity 340 with an etchant introduced through openings in the piezoelectric plate 310. The illustrated shape of the cavity is not based on simulation or measurement of an actual etching process.

In FIG. 3B, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers, such as finger 336, of an IDT are disposed on the diaphragm 315. The cavity 340 has been formed by etching the substrate 320 with a selective etchant that reaches the substrate through one or more openings 342 in the piezoelectric plate 310. The lateral extent of the cavity 340 is defined by a lateral etch-stop 350, where "lateral" is defined as any direction parallel the surfaces of the piezoelectric plate 110. While the lateral etch-stop 350 is shown in cross-section in FIG. 3B, it should be understood that the lateral etch-stop 350 is a continuous closed band of etch-stop material that surrounds the cavity 340 such that the lateral etch-stop 350 defines the size of the cavity 340 in the direction normal to the plane of the drawing. In this patent, the term "lateral" encompasses any direction parallel to the surfaces of the substrate and piezoelectric plate.

The lateral etch-stop 350 is formed from an etch-stop material that is substantially impervious to the process and etchant used to form the cavity 340. An etch-stop material is considered "substantially impervious" if the lateral etch-stop fulfills its function of controlling the lateral growth of the cavity. The etch-stop material may not be etched by the process used to form the cavity, or may be etched sufficiently slowly that the lateral etch-stop constrains the lateral extent of the cavity 340. When the substrate 320 is silicon, the etchant may be, for example, $XeF_2$ and the etch-stop material may be, for example, silicon oxide ($SiO_x$), silicon nitride, silicon oxynitride, a metal oxide, a metal nitride, a glass, a ceramic, or a polymer material. Different etch-stop materials and different etchants may be used with different substrate materials. In all cases, the etch-stop material is different from the substrate material.

The lateral etch-stop 350 constrains the growth of the cavity 340 laterally but not vertically. The bottom of the cavity 340 will not be parallel to the piezoelectric plate 310. The deepest portions of the cavity will be proximate the openings 342 and the minimum depth of the cavity will occur near the center of the diaphragm 315.

In FIG. 3C, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers, such as finger 336, of an IDT are disposed on the diaphragm 315. The cavity 340 has been formed by etching the substrate 320 with a selective etchant that reaches the substrate through one or more openings 342 in the piezoelectric plate 310. The lateral (i.e. left-right as shown in the figure) extent of the cavity 340 is defined by a lateral etch-stop 350. While the lateral etch-stop 350 is shown in cross-section in FIG. 3B, it should be understood that the lateral etch-stop 350 is a continuous closed band of etch-stop material that surrounds the cavity 340 such that the lateral etch-stop 350 also defines the size of the cavity 340 in the direction normal to the plane of the drawing. The vertical (i.e. the dimension normal to the surface of the piezoelectric plate 310) extent or depth of the cavity is defined by a vertical etch stop 352. In this case, the cavity 340 has a rectangular, or nearly rectangular, cross section.

The lateral etch-stop 350 and the vertical etch-stop 352 are formed from the same etch-stop material or different etch-stop materials, all of which are substantially impervious to the process and etchant used to form the cavity 340. The lateral etch-stop 350 and the vertical etch-stop 352 may be materials that are not etched by the etch process used to form the cavity, or that are etched sufficiently slowly that the etch-stop constrains the lateral extent of the cavity 340 and the vertical etch-stop 352 defines the depth of the cavity. When the substrate 320 is silicon, the etchant may be, for example, $XeF_2$. The lateral etch-stop 350 and the vertical etch-stop 352 may be, for example, $SiO_2$, $Si_3N_4$, a metal oxide, a metal nitride, a glass, a ceramic, or a polymer material. Different etch-stop materials and different etchants may be used with different substrate materials.

Figure 3D:
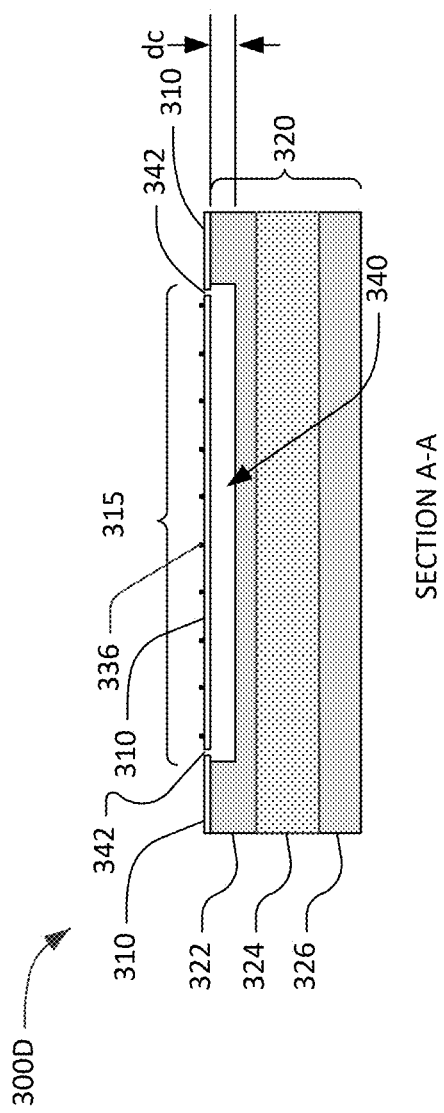
FIG. 3D is an alternative schematic cross-sectional view of the XBAR.

FIG. 3D is an alternative cross-sectional view of XBAR device 300D along the section plane A-A defined in FIG. 1. In FIG. 3D, a piezoelectric plate 310 is attached to a substrate 320 having an upper layer 322 of silicon thermal oxide (TOX) attached to a middle layer 324 of crystalline silicon which is attached to a lower layer of silicon TOX 326. Layers 322, 324 and 326 may be attached to each other by: being chemically or atomically formed one each other; being chemically or adhesively bonded to each other; or by being a single substrate of crystalline silicon material that is chemically and/or thermally treated on its top and bottom surface to create the silicon TOX layers. A portion of the piezoelectric plate 310 forms a diaphragm 315 spanning a cavity 340 in the substrate. The cavity 340, does not fully penetrate the substrate layer 322, and is formed in the substrate under the portion of the piezoelectric plate 310 containing the IDT of an XBAR. Fingers, such as finger 336, of an IDT are disposed on the diaphragm 315.

The cavity 340 may be formed, by etching the a sacrificial layer of polycrystalline silicon (not shown since it was etched away) formed in an area of substrate layer 322 with a selective etchant that reaches the sacrificial layer through one or more openings 342 provided in the piezoelectric plate 310. In this case, the diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers (not shown) may be attached between plate 310 and substrate layer 322. An intermediary layer may be an etch stop layer, a sealing layer, an adhesive layer or layer of other material that is attached or bonded to plate 310 and substrate layer 322. In other embodiments, the piezoelectric plate 310 is attached directly to the substrate layer 322 and an intermediary layer does not exist. In some cases, an intermediary layer is a so-called "trap-rich" layer (not shown) that reduces the effect of a conducting surface layer in a silicon handle wafer is added between the TOX layer 322 and the silicon substrate layer 324.

While the cavity 340 is shown in cross-section, it should be understood that the lateral extent of the cavity is a continuous closed band area of layer 322 that surrounds and defines the size of the cavity 340 in the direction normal to the plane of the drawing. The lateral (i.e. left-right as shown in the figure) extent of the cavity 340 is defined by the lateral edges of the sacrificial layer formed in layer 322. The vertical (i.e. down from plate 310 as shown in the figure) extent or depth of the cavity 340 may be defined by the thickness of the sacrificial layer formed in layer 322. In this case, the cavity 340 has a side cross-section rectangular, or nearly rectangular, cross section.

The silicon TOX (TOX=Thermal Oxide) material of layer 322 is substantially impervious to the process and etchant used to form the cavity 340. The material of layer 322 may be a material is that not etched by the etch process used to etch the sacrificial material to form the cavity, or that is etched sufficiently slowly that the silicon TOX layer constrains the lateral and vertical extent of the cavity 340. When the sacrificial layer is polysilicon, the etchant may be, for example, $XeF_2$. The silicon TOX layer may be, for example, SiOx, such as SiO, $SiO_2$, $SiO_3$, or the like. Different sacrificial materials and different etchants may be used with different substrate TOX layer 322 materials.

The cavity 340 is formed by etching the sacrificial layer to surfaces of layer 322 with a selective etchant that reaches the substrate through the openings 342 in the piezoelectric plate 310. The process used to form the cavity 340 will introduce a dry gaseous etchant or a wet etchant such as an HF acid etchant via the openings 342. This etchant will etch isotropically, causing the cavity to expand in all directions from the openings 342. The resulting cavity will effectively increase the area of the diaphragm 315 until it reaches material of layer 322, where the etching will stop which avoids having the etch extend and create a cavity that extends beyond the area occupied by the IDT as shown by the shape of the cavity in FIG. 3D. Resistive and acoustic losses in the IDT generate heat in the diaphragm. Enlarging the diaphragm area beyond the area of the IDT increases the difficulty of removing the heat from the diaphragm and creates excessive membrane sizes that may be mechanically unstable. Making use of a controlled and predefined cavity structure that is etched using a self-limiting process step leads to a manufacturable method for making XBAR resonators.

Consequently, using the sacrificial layer provides better control of forming the cavity and selection of a predetermined area size and depth for the cavity. It also allows forming of a smaller cavity than other processes such as those for FIG. 3A. In some cases, the cavity 340 has a length Lc of between 50 um and 500 um; and width We of between 20 um and 200 um. In some cases, cavity depth dc is between 2 and 50 microns and is less than the thickness of layer 322. The cavity depth dc must be sufficiently deep that the XBAR membrane cannot 'bottom out' and touch the substrate in the cavity.

Figure 3E:
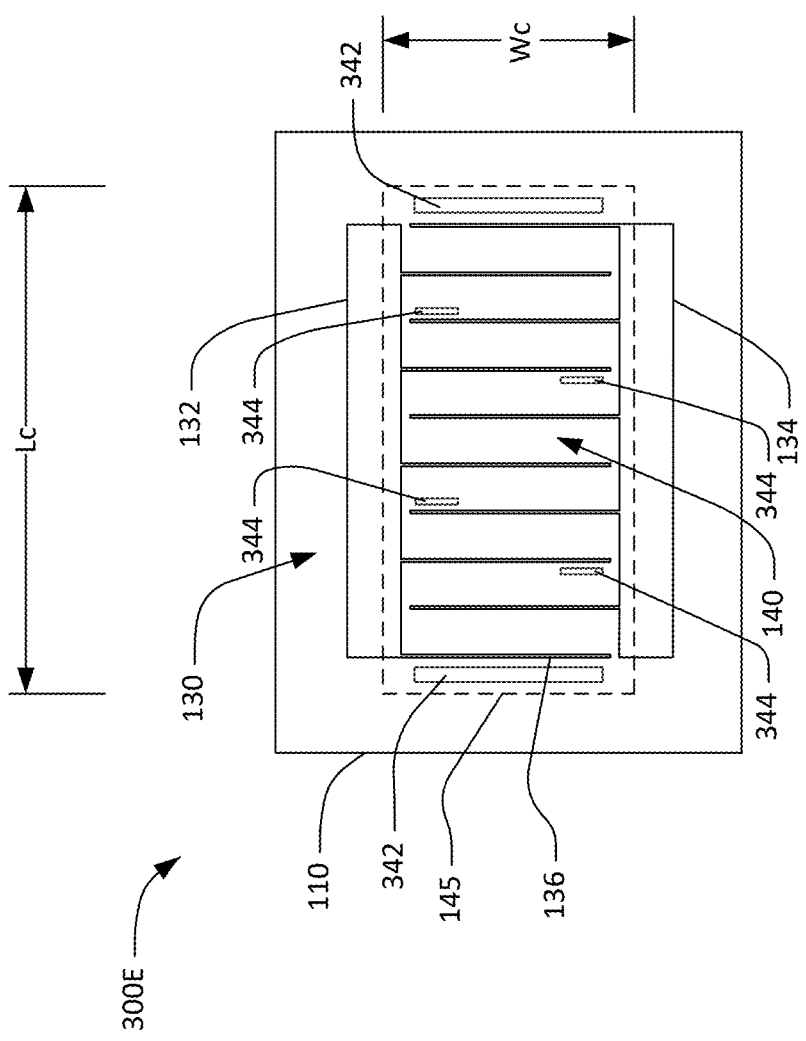
FIG. 3E shows a simplified schematic top view of an XBAR.

FIG. 3E shows a simplified schematic top view of a transversely-excited film bulk acoustic resonator (XBAR) 300E. Device 300E is similar to device 300D except that in addition to openings 342 within perimeter 145 for etching through to form cavity 340, device 300E also includes other openings 344 through plate 310 between the fingers 336. The openings 344 may be circular holes or elongated slots or some other shape. Thus, resonator device 300E shows an example of a final resonator structure with etch openings 342 and 344; IDT 130; pad metal 132, 134; and cavity perimeter dashed line 145 indicating the cavity area above which the plate 310 is a free-standing component. In this case, the cavity 340 has a top perspective rectangular, or nearly rectangular, cross section.

The XBARs 300A-300E shown in FIGS. 3A-3E will be referred to herein as a "front-side etch" configurations since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBARs 300A-300E show one or more openings 342 in the piezoelectric plate 310 at the left and right sides of the cavity 340. However, in some cases openings 342 in the piezoelectric plate 310 are only at the left or right side of the cavity 340.

The XBARs of FIG. 1 and FIGS. 3A-3E and filter devices using XBARs may be encased in a package. The package for an XBAR must perform the following functions:
Provide mechanical protection for the diaphragms and conductor patterns;
Provide cavities facing the diaphragms comparable to the cavity 340 in the substrate 320;
Provide a seal to prevent intrusion of humidity and/or fluids that may be encountered during subsequent assembly of the packaged filter into an electronic device; and
Provide means for connecting the conductor patterns of the XBARs to circuitry external to the packaged filter device.

Figure 3F:
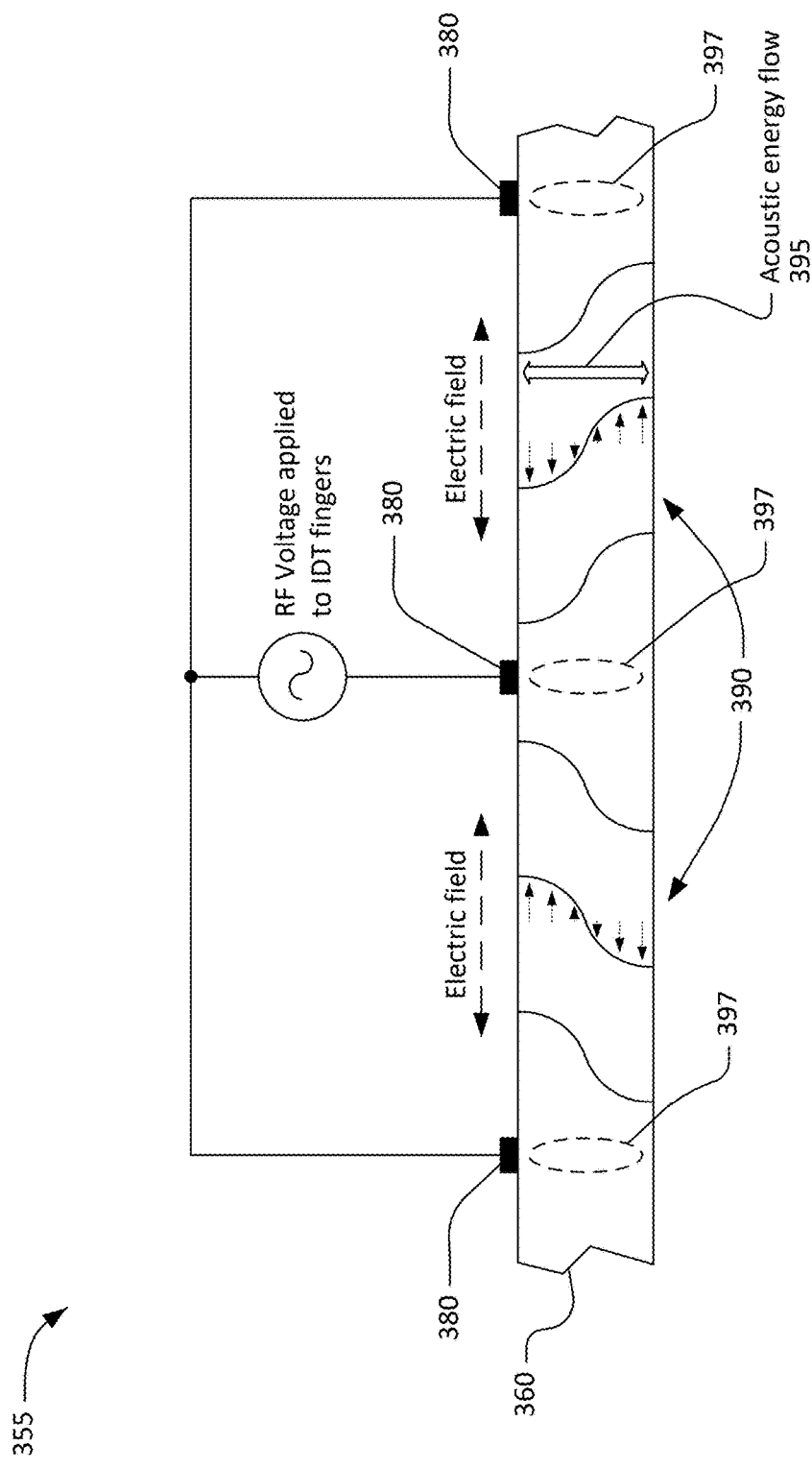
FIG. 3F is a graphical illustration of the primary acoustic mode of interest in an XBAR.

FIG. 3F is a graphical illustration of the primary acoustic mode of interest in an XBAR. FIG. 3F shows a small portion of an XBAR 355 including a piezoelectric plate 360 and three interleaved IDT fingers 380. XBAR 355 may be part of any XBAR herein. An RF voltage is applied to the interleaved fingers 380. This voltage creates a time-varying electric field between the fingers. The direction of the electric field is lateral, or parallel to the surface of the piezoelectric plate 360, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 360. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 355 are represented by the curves 390, with the adjacent small arrows providing a schematic indication of the direction and magnitude of atomic motion. The degree of atomic motion, as well as the thickness of the piezoelectric plate 360, have been greatly exaggerated for ease of visualization. While the atomic motions are predominantly lateral (i.e. horizontal as shown in FIG. 3F), the direction of acoustic energy flow of the excited primary shear acoustic mode is substantially orthogonal to the front and back surface of the piezoelectric plate, as indicated by the arrow 395.

Considering FIG. 3F, there is essentially no electric field immediately under the IDT fingers 380, and thus acoustic modes are only minimally excited in the regions 397 under the fingers. There may be evanescent acoustic motions in these regions. Since acoustic vibrations are not excited under the IDT fingers 380, the acoustic energy coupled to the IDT fingers 380 is low (for example compared to the fingers of an IDT in a SAW resonator), which minimizes viscous losses in the IDT fingers.

Description of Methods

Figure 4:
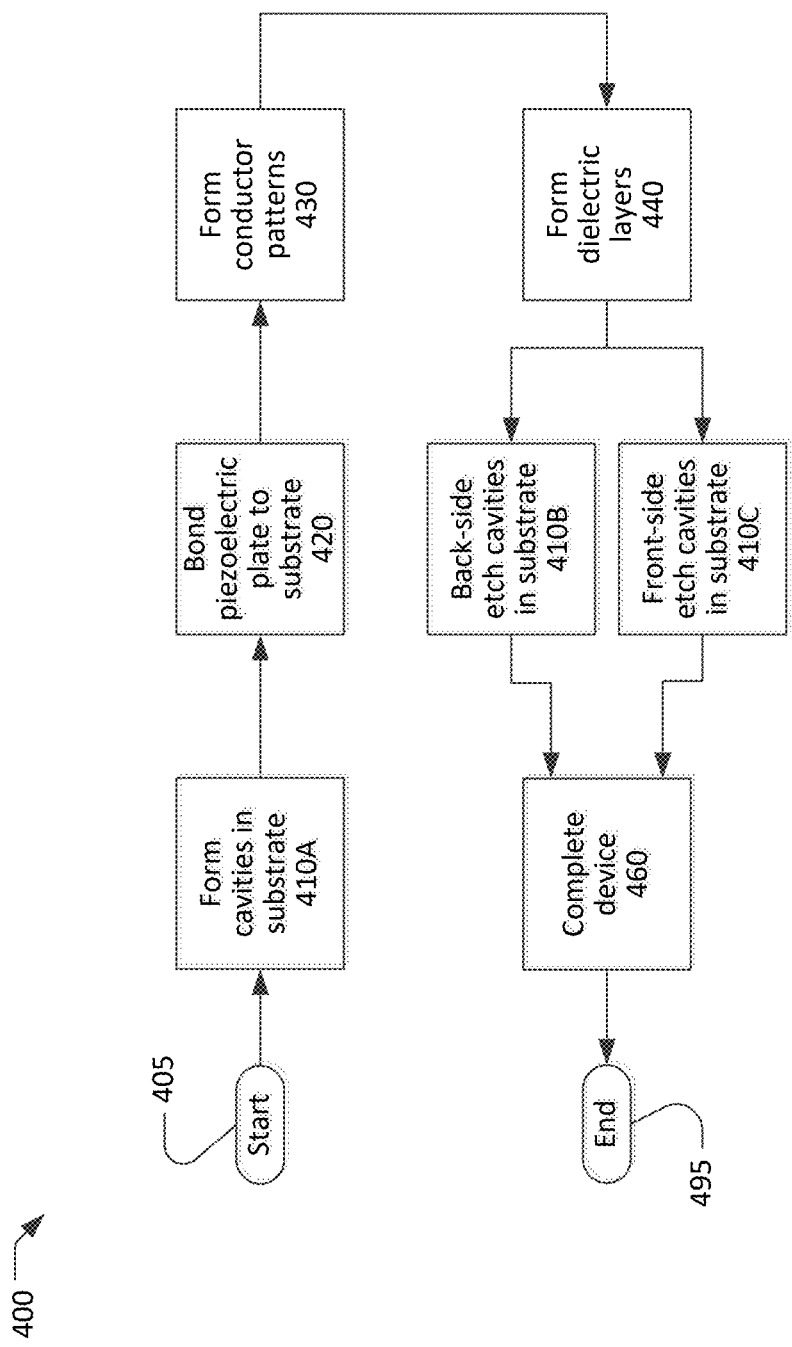
FIG. 4 is a flow chart of a conventional process for fabricating an XBAR.

FIG. 4 is a simplified flow chart showing a process 400 for making an XBAR or a filter incorporating XBARs. The process 400 starts at 405 with a substrate and a plate of piezoelectric material and ends at 495 with a completed XBAR or filter. As will be described subsequently, the piezoelectric plate may be mounted on a sacrificial substrate or may be a portion of wafer of piezoelectric material. The flow chart of FIG. 4 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 4.

The flow chart of FIG. 4 captures three variations of the process 400 for making an XBAR which differ in when and how cavities are formed in the substrate. The cavities may be formed at steps 410A, 410B, or 410C. Only one of these steps is performed in each of the three variations of the process 400.

The piezoelectric plate may be, for example, Z-cut, rotated Z-cut, or rotated Y-cut lithium niobate or lithium tantalate. The piezoelectric plate may be some other material and/or some other cut. The substrate may be silicon. The substrate may be some other material that allows formation of deep cavities by etching or other processing. The silicon substrate may have layers of silicon TOX and polycrystalline silicon.

In one variation of the process 400, one or more cavities are formed in the substrate 320 at 410A, before the piezoelectric plate is bonded to the substrate at 420. A separate cavity may be formed for each resonator in a filter device. The one or more cavities may be formed using conventional photolithographic and etching techniques. These techniques may be isotropic or anisotropic; and may use deep reactive ion etching (DRIE). Typically, the cavities formed at 410A will not penetrate through the substrate or layer 322, and the resulting resonator devices will have a cross-section as shown in FIG. 3D.

At 420, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

In a first variation of 420, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 420 starts with a single-crystal piezoelectric wafer. Ions are implanted to a controlled depth beneath a surface of the piezoelectric wafer (not shown in FIG. 4). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

Conductor patterns and dielectric layers defining one or more XBAR devices are formed on the surface of the piezoelectric plate at 430. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 430 by depositing the conductor layers over the surface of the piezoelectric plate and removing excess metal by etching through patterned photoresist. Alternatively, the conductor patterns may be formed at 430 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern. In some cases, forming at 430 occurs prior to bonding at 420, such as where the IDT's are formed prior to bonding the plate to the substrate.

At 440, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 640 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device. The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs.

As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XBAR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

In a second variation of the process 400, one or more cavities are formed in the back side of the substrate at 410B after all the conductor patterns and dielectric layers are formed at 430. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 400, one or more cavities in the form of recesses in the substrate top layer 322 may be formed at 410C by etching a sacrificial layer formed in the front side of the substrate using an etchant introduced through openings in the piezoelectric plate. A separate cavity may be formed for each resonator in a filter device. The one or more cavities may be formed using an isotropic or orientation-independent dry etch that passes through holes in the piezoelectric plate and etches the sacrificial layer formed in recesses in the front-side of the substrate. The one or more cavities formed at 410C will not penetrate completely through the substrate top layer 322, and the resulting resonator devices will have a cross-section as shown in FIG. 3D or 3E.

In all variations of the process 400, the filter or XBAR device is completed at 460. Actions that may occur at 460 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 460 is to tune the resonant frequencies of the resonators within a filter device by adding or removing metal or dielectric material from the front side of the device. After the filter device is completed, the process ends at 495. FIGS. 1-3F may show examples of the fingers of selected IDTs after completion at 460.

Forming the cavities at 410A may require the fewest total process steps but has the disadvantage that the XBAR diaphragms will be unsupported during all of the subsequent process steps. This may lead to damage to, or unacceptable distortion of, the diaphragms during subsequent processing.

Forming the cavities using a back-side etch at 410B requires additional handling inherent in two-sided wafer processing. Forming the cavities from the back side also greatly complicates packaging the XBAR devices since both the front side and the back side of the device must be sealed by the package.

Forming the cavities by etching from the front side at 410C does not require two-sided wafer processing and has the advantage that the XBAR diaphragms are supported during all of the preceding process steps. However, an etching process capable of forming the cavities through openings in the piezoelectric plate will necessarily be isotropic. However, as illustrated in FIG. 3D and FIG. 8, such an etching process using a sacrificial material allows for a controlled etching of the cavity, both laterally (i.e. parallel to the surface of the substrate) as well as normal to the surface of the substrate.

Figure 5A:
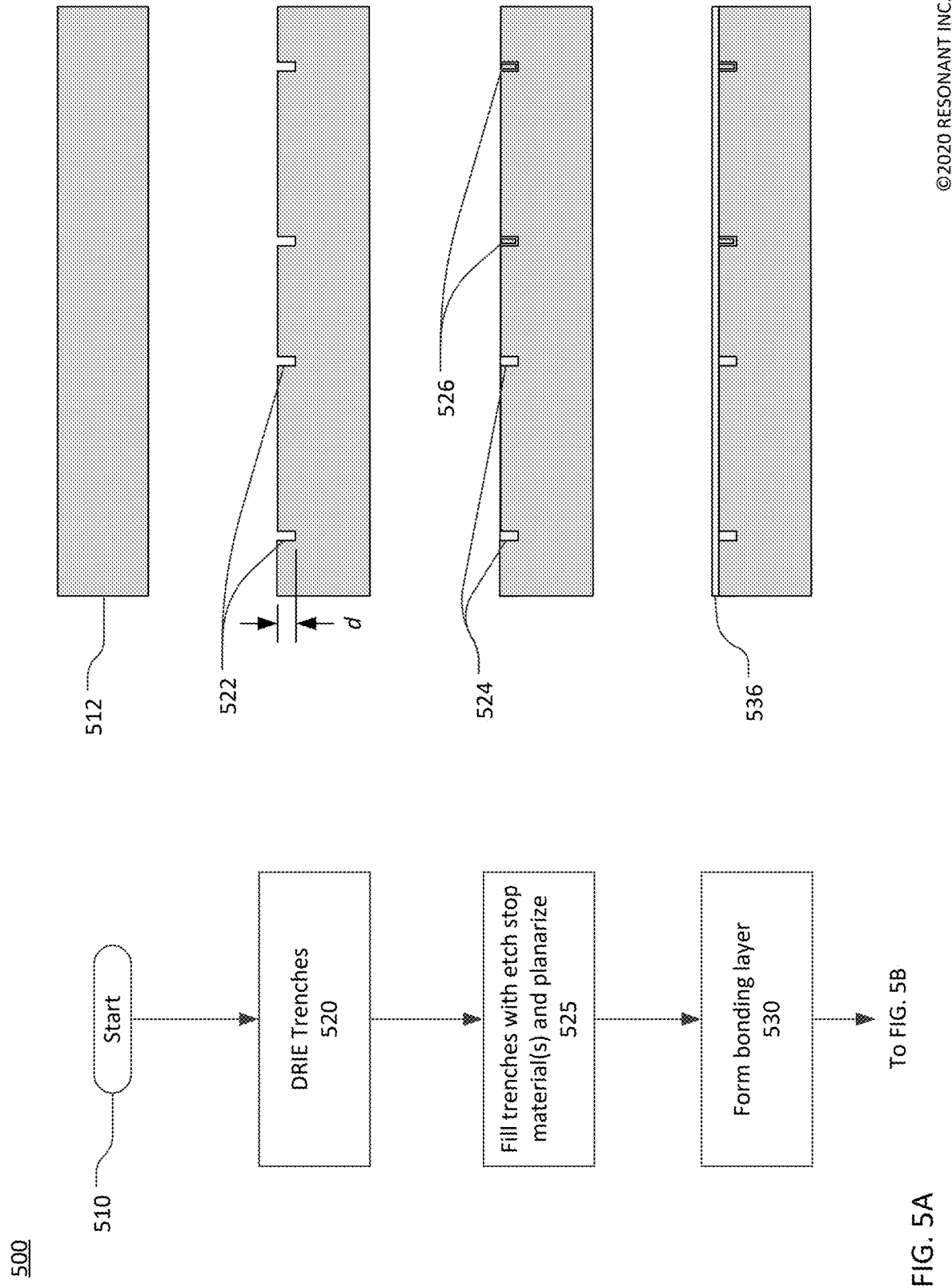
FIG. 5A, FIG. 5B, and FIG. 5C (collectively "FIG. 5") are a flow chart of a process for fabricating an XBAR using a lateral etch stop.
Figure 5B:
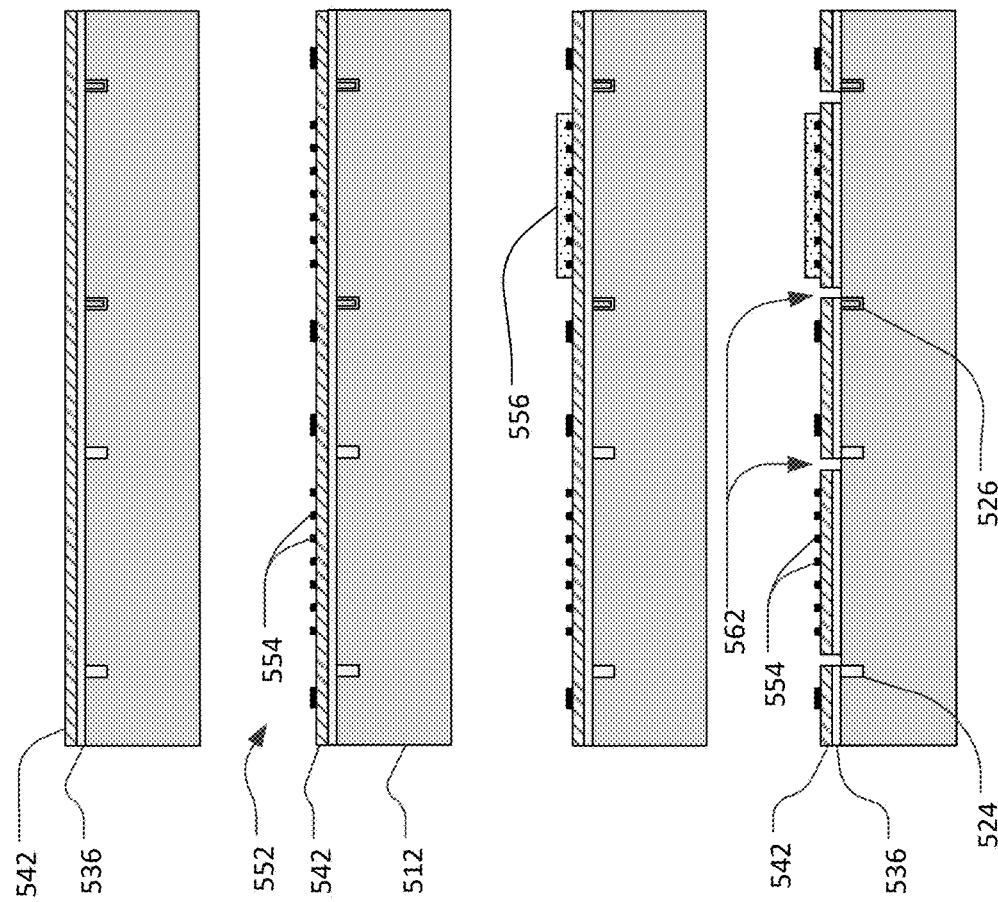
Figure 5B:
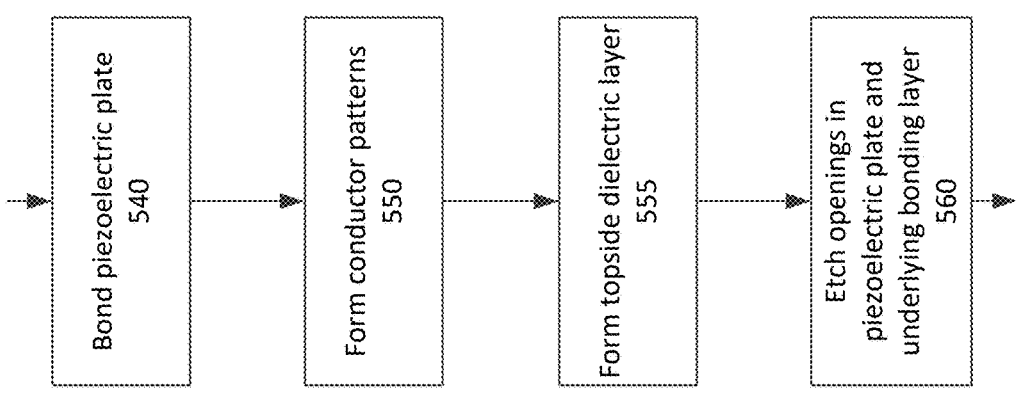
Figure 5C:
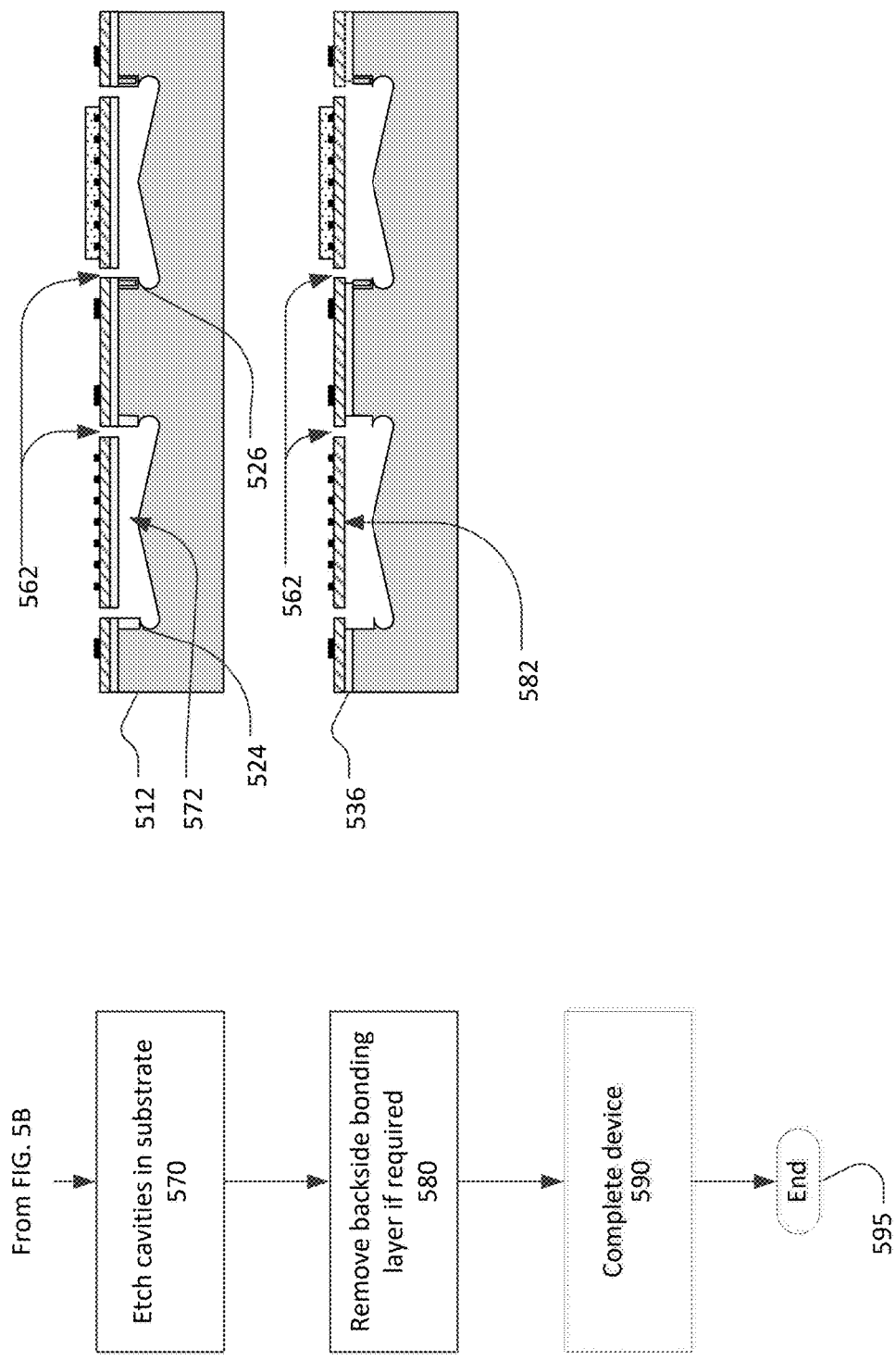

FIG. 5A, FIG. 5B, and FIG. 5C (collectively "FIG. 5") are a simplified flow chart of an improved process 500 for fabricating an XBAR with a lateral etch-stop (for example, lateral etch-stop 350 in FIG. 3B). To the right of each action in the flow chart is a schematic cross-sectional view representing the end of each action. The process 500 starts at 510 in FIG. 5A with a substrate 512 and a plate of piezoelectric material. The piezoelectric plate may be mounted on a sacrificial substrate or may be a portion of wafer of piezoelectric material as previously described. The process 500 ends at 595 in FIG. 5C with a completed resonator or filter device. The flow chart of FIG. 5 includes only major process steps. Various conventional process steps (e.g. surface preparation, cleaning, inspection, deposition, photolithography, baking, annealing, monitoring, testing, etc.) may be performed before, between, after, and during the steps shown in FIG. 5.

At 520, trenches 522 are formed in the substrate 512 in the locations where the lateral etch stop is desired. While the trenches 522 are only shown in cross-section in FIG. 5A, it must be understood that each etch-stop trench is a ring completely around the perimeter of what will become a cavity. The trenches 522 may be formed by etching the substrate through a suitable mask such as a photoresist mask or a hard mask. The trenches may be etched into the substrate using a suitable wet or dry etching process. For example, when the substrate is silicon, the trenches may be formed using deep reactive ion etching (DRIE). Other etching processes may be used on other substrate materials.

The depth d of the trenches 522 may be preferably, but not necessarily, greater than or equal to an intended maximum depth of the cavity adjacent to the etch-stop.

At 525, lateral etch-stops are formed by filling the trenches 522 with one or more etch-stop materials. The etch-stop material or materials may be grown on the substrate and/or deposited onto the substrate using conventional deposition processes such as thermal oxidation, evaporation, sputtering, or chemical vapor deposition. The etch-stop material or materials may be any materials that will function to constrain the lateral growth of the cavity to be etched in the substrate 512. When the substrate 512 is silicon, suitable etch-stop materials include silicon dioxide, silicon nitride, and aluminum oxide.

The lateral etch-stops formed at 520 may be a single material, as shown for lateral etch-stop 524, which may one of the previously described etch-stop materials deposited by a conventional process such as sputtering or chemical vapor deposition. The lateral etch-stops may be two or more materials as shown for lateral etch-stop 526. For example, when the substrate 512 is silicon, a layer of silicon dioxide may first be grown on the surface of the substrate 512 and the interior of the trenches 522. Grown oxide typically has fewer pinholes and other defects than deposited materials. Subsequently, a second material may be deposited over the grown oxide on the surface of the substrate 512 and within the trenches 522. As will be discussed subsequently, there may be some benefit to depositing a material other than silicon dioxide over the grown oxide.

After the trenches 522 are filled with one or more materials to form the lateral etch-stops 524, 526, the surface of the substrate 512 will be uneven and must be planarized. Planarization may be performed by mechanical polishing, by chemo-mechanical polishing, or some other method.

At 530, a bonding layer 536 is formed on the planarized surface of the substrate. The bonding layer may silicon dioxide or some material capable of bonding to the piezoelectric material (typically lithium niobate or lithium tantalate) to be used in the XBAR. The bonding layer may be formed by a conventional process such as evaporation, sputtering, chemical vapor deposition or molecular beam epitaxy.

Referring now to FIG. 5B, at 540, a piezoelectric plate 542 is bonded to the bonding layer 536. Techniques for bonding the piezoelectric plate were previously described for action 420 in the process 400 of FIG. 4. The description of those techniques will not be repeated.

At 550, conductor patterns 552 are formed on the surface of the piezoelectric plate 542. The conductor patterns include IDT fingers 554 disposed on portions of the piezoelectric plate 542 where cavities will be formed in the substrate. The structure of and techniques for forming the conductor patterns were previously described for action 430 in the process 400 of FIG. 4. These descriptions will not be repeated.

At 555, one or more dielectric layers may be formed on the surface of the piezoelectric plate 542 over the conductor patterns 552. The dielectric layers may include a layer 556 selectively formed over the IDT fingers of shunt resonators. The structure of and techniques for forming the dielectric layers were previously described for action 440 in the process 400 of FIG. 4. These descriptions will not be repeated.

At 560, openings 562 are etched through the piezoelectric plate 542 and the underlying bonding layer 536. The openings 562 may be circular holes or elongated slots or some other shape. As shown in FIG. 5B, the openings 562 are adjacent to the area occupied by the IDT fingers 554. In other embodiments, there may be openings within the area of the IDT fingers. In all cases, the openings 562 are within regions encircled by the lateral etch stops 524, 526.

Referring now to FIG. 5C, at 570, cavities 572 are etched into the substrate 512 using a first liquid or gaseous etchant introduced via the openings 562. The lateral growth of the cavities 572 is constrained by the lateral etch-stops 524, 526, and the shape of the bottoms of the cavities is uncontrolled. The depth of the cavities 572 is limited only by the duration of the etching process. Some lateral growth of the cavities may occur, as shown in FIG. 5C, if the depth of the cavities exceeds the height of the lateral etch-stops 524, 526. The shape of the cavities 572 shown in FIG. 5C is exemplary but not based on simulation or measurement of actual etched cavities.

Depending on the material and thickness of the bonding layer 536, it may be necessary to remove the bonding layer material from the back side 582 of the diaphragms. To this end, a second liquid or gaseous etchant is introduced via the openings 562. If the lateral etch-stops 524, 526 include the same material as the bonding layer 536, removal of the bonding layer material from the back side 582 of the diaphragms may also remove all or part of the lateral etch-stops.

The filter device is then completed at 590. Actions that may occur at 590 include depositing an encapsulation/passivation layer such as $SiO_2$ or $Si_3O_4$ over all or a portion of the device and/or forming bonding pads or solder bumps or other means for making connection between the device and external circuitry if these steps were not performed at 550. Other actions at 590 may include excising individual devices from a wafer containing multiple devices; other packaging steps; and testing. Another action that may occur at 590 is to tune the resonant frequencies of the resonators within the device by adding or removing metal or dielectric material from the front side of the device. After the filter device is completed, the process ends at 595.

Figure 6A:
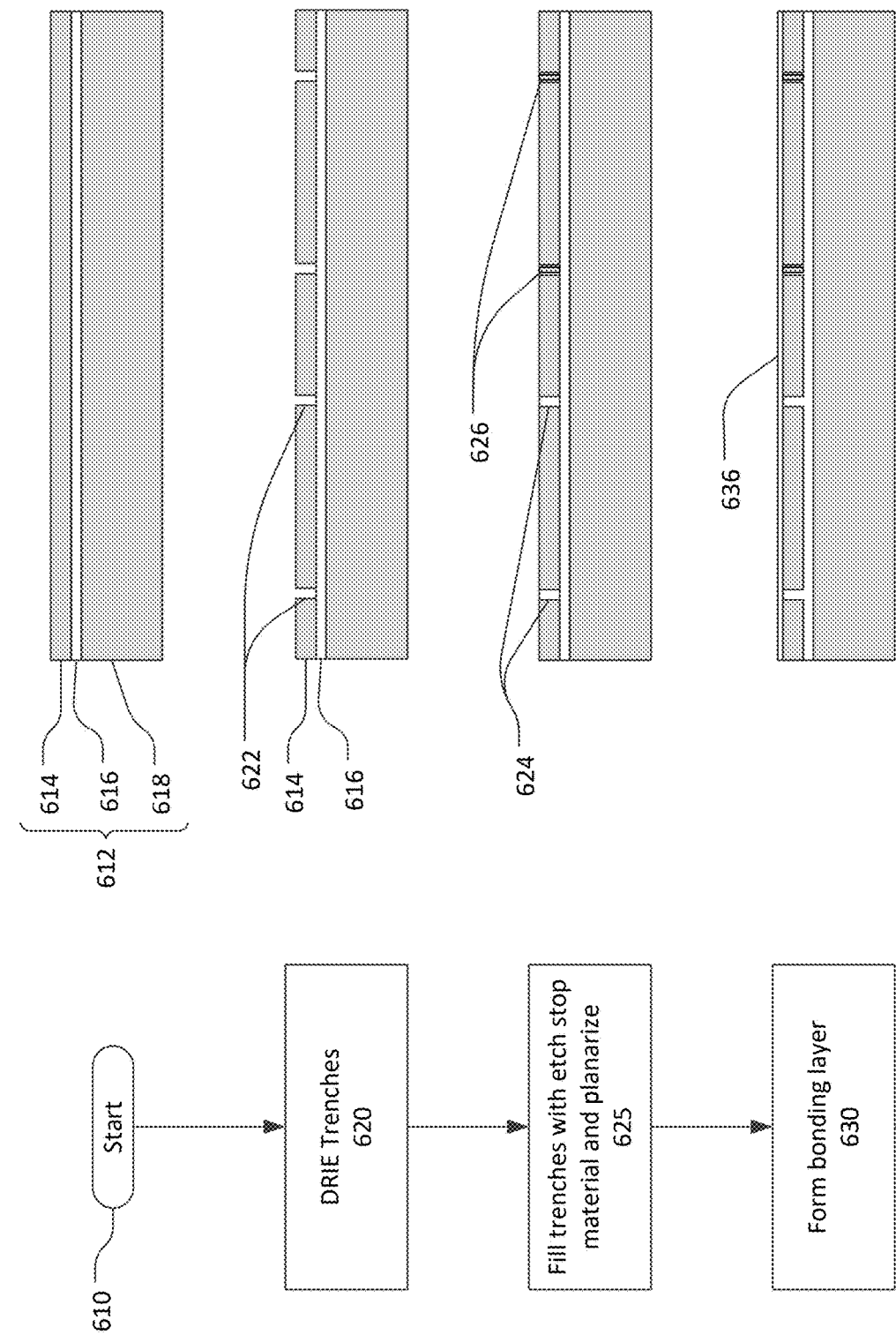
FIG. 6A, FIG. 6B, and FIG. 6C (collectively "FIG. 6") are a flow chart of another process for fabricating an XBAR using a lateral etch stop.
Figure 6B:
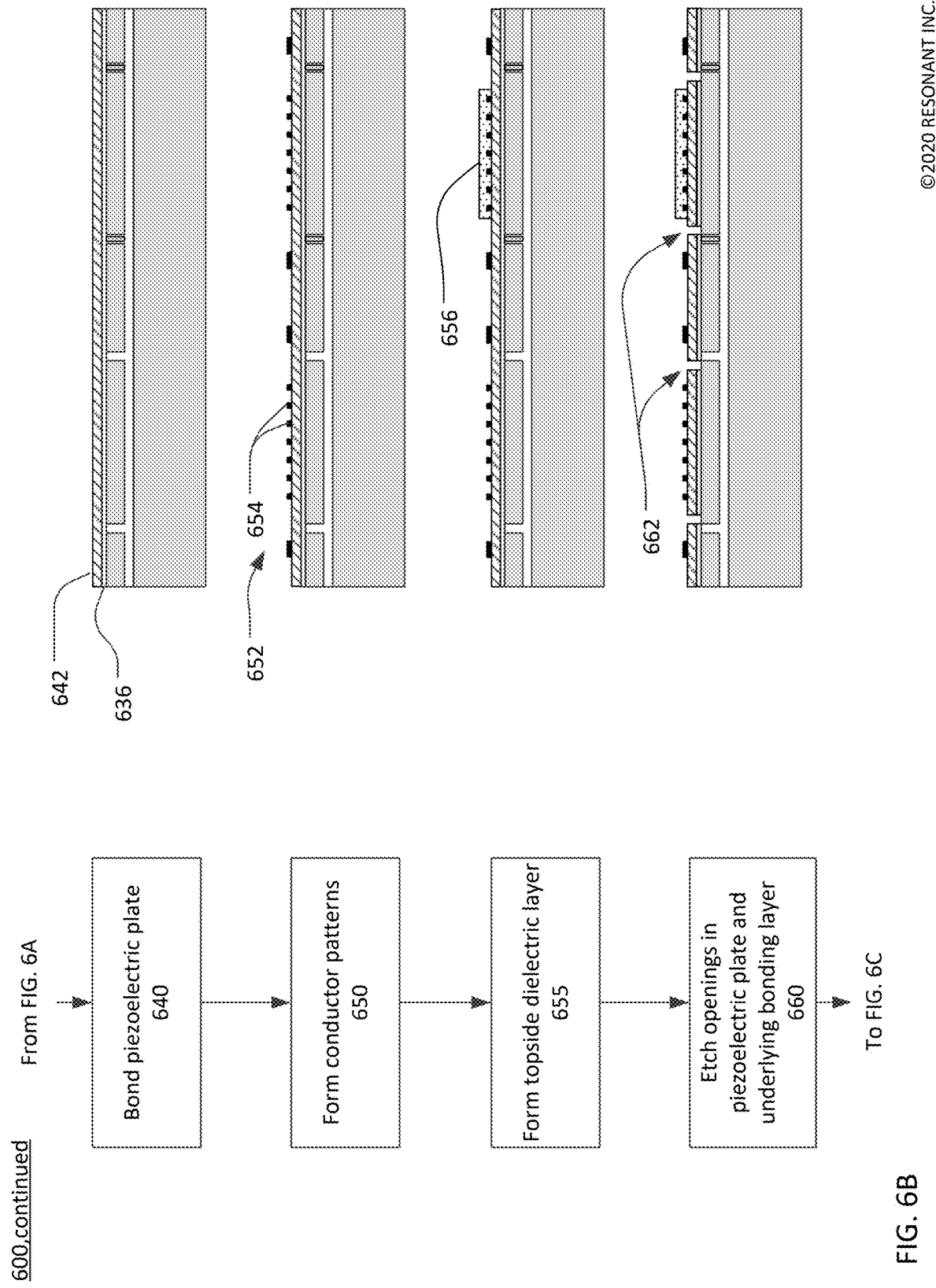
Figure 6C:
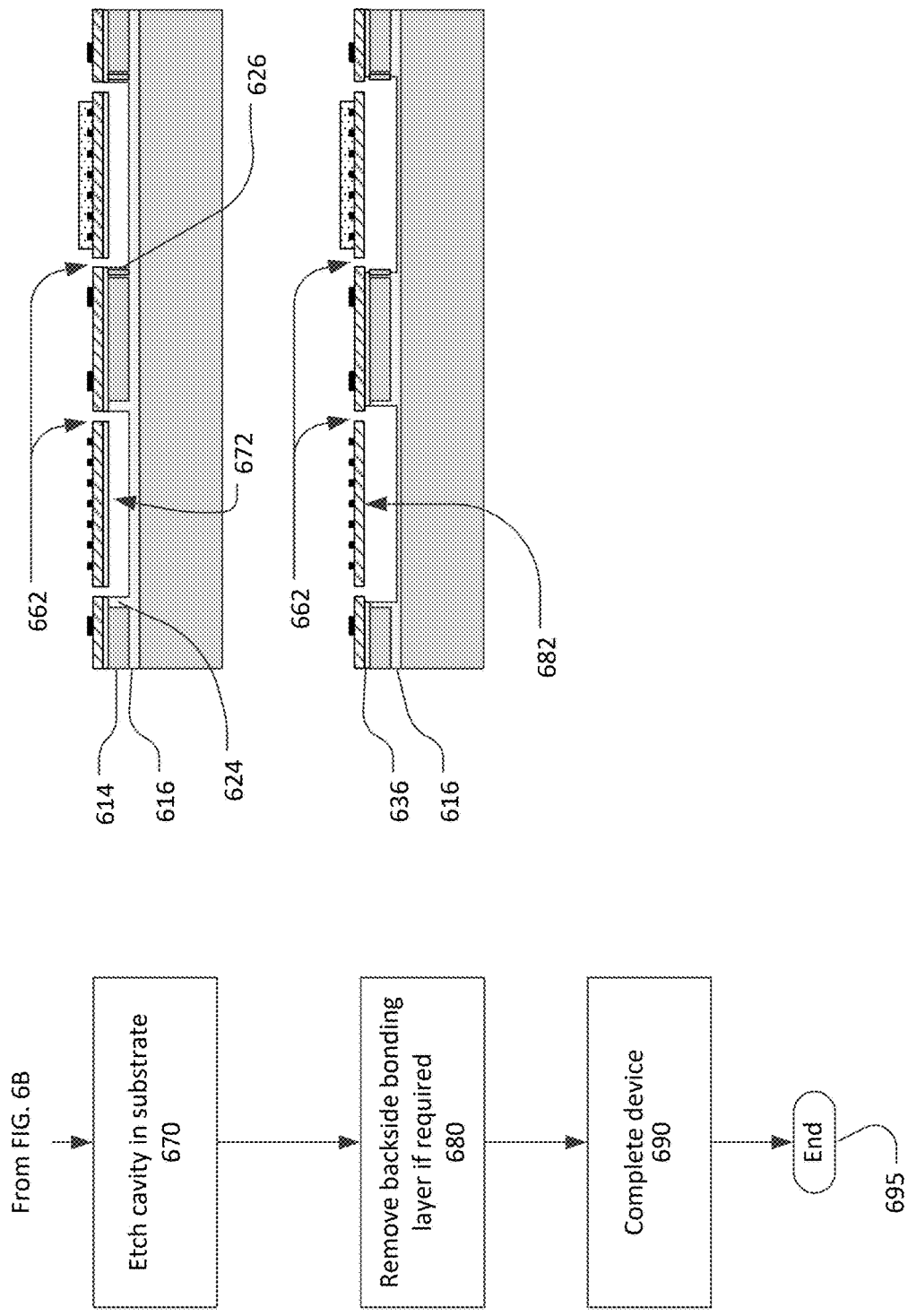

FIG. 6A, FIG. 6B, and FIG. 6C (collectively "FIG. 6") are a simplified flow chart of another process 600 for fabricating an XBAR. The process 600 uses both a lateral etch-stop and a vertical etch-stop (for example, lateral etch-stop 350 and vertical etch-stop 352 in FIG. 3C). To the right of each action in the flow chart is a schematic cross-sectional view representing the end of each action.

The process 600 starts at 610 in FIG. 6A with a substrate 612 and a plate of piezoelectric material. The substrate 612 is a laminate comprising a device layer 614, a buried layer 616, and a handle layer 618. For example, the device layer 614 may be silicon with a thickness between 15 and 100 microns. The buried layer 616 may be a silicon dioxide layer grown on one or both of the handle layer 618 and the device layer 614. The thickness of the buried oxide layer 616 may be about 2 microns. The handle layer 618 may be a silicon wafer having a thickness of about 250 microns to 1000 microns. The device, buried, and handle layers are typically bonded together using a wafer bonding process. Other combinations of material may be used for the device, buried, and handle layers. The buried is an etch-stop material as previously described.

The piezoelectric plate may be mounted on a sacrificial substrate or may be a portion of wafer of piezoelectric material as previously described. The process 600 ends at 695 in FIG. 6C with a completed resonator or filter device. The flow chart of FIG. 6 includes only major process steps. Various conventional process steps (e.g. surface preparation, cleaning, inspection, deposition, photolithography, baking, annealing, monitoring, testing, etc.) may be performed before, between, after, and during the steps shown in FIG. 6.

At 620, trenches 622 are formed in the device layer 614 in the locations where the lateral etch stop is desired. While the trenches 622 are only shown in cross-section in FIG. 5A, it must be understood that each etch-stop trench is a ring completely around the perimeter of what will become a cavity. The trenches 622 may be formed by etching the substrate through a suitable mask such as a photoresist mask or a hard mask. The trenches may be etched into the substrate using a suitable wet or dry etching process. For example, when the substrate is silicon, the trenches may be formed using deep reactive ion etching (DRIE). Other etching processes may be used on other substrate materials.

So long as the process used to etch the trenches 522 does not etch the buried layer 616, the depth of the trenches 622 is determined by the thickness of the device layer 614.

At 625, lateral etch-stops are formed by filling the trenches 622 with one or more etch-stop materials. The etch-stop material or materials may be grown on the substrate and/or deposited onto the substrate using conventional deposition processes such as thermal oxidation, evaporation, sputtering, or chemical vapor deposition. The etch-stop material or materials may be any materials that will function to constrain the lateral growth of the cavity to be etched in the device layer 614. When the device layer 614 is silicon, suitable etch-stop materials include silicon dioxide, silicon nitride, and aluminum oxide.

The lateral etch-stops formed at 620 may be a single material, as shown for lateral etch-stop 624, which may one of the previously described etch-stop materials deposited by a conventional process such as sputtering or chemical vapor deposition. The lateral etch-stops may be two or more materials as shown for lateral etch-stop 626. For example, when the device layer 614 is silicon, a layer of silicon dioxide may first be grown on the surface of the device layer 614 and the interior of the trenches 622. Grown oxide typically has fewer pinholes and other defects than deposited materials. Subsequently, a second material may be deposited over the grown oxide on the surface of the device layer 614 and within the trenches 622. As will be discussed subsequently, there may be some benefit to depositing a material other than silicon dioxide over the grown oxide.

After the trenches 622 are filled with one or more materials to form the lateral etch-stops 624, 626, the surface of the substrate 612 will be uneven and must be planarized. Planarization may be performed by mechanical polishing, by chemo-mechanical polishing, or some other method.

At 630, a bonding layer 636 is formed on the planarized surface of the device layer 614. The bonding layer may silicon dioxide or some material capable of bonding to the piezoelectric material (typically lithium niobate or lithium tantalate) to be used in the XBAR. The bonding layer may be formed by a conventional process such as evaporation, sputtering, chemical vapor deposition or molecular beam epitaxy.

Referring now to FIG. 6B, at 640, a piezoelectric plate 642 is bonded to the bonding layer 636. Techniques for bonding the piezoelectric plate were previously described for action 420 in the process 400 of FIG. 4. The description of those techniques will not be repeated.

At 650, conductor patterns 652 are formed on the surface of the piezoelectric plate 642. The conductor patterns include IDT fingers 654 disposed on portions of the piezoelectric plate 642 where cavities will be formed in the substrate. The structure of and techniques for forming the conductor patterns were previously described for action 430 in the process 400 of FIG. 4. These descriptions will not be repeated.

At 655, one or more dielectric layers may be formed on the surface of the piezoelectric plate 642 over the conductor patterns 652. The dielectric layers may include a layer 656 selectively formed over the IDT fingers of shunt resonators. The structure of and techniques for forming the dielectric layers were previously described for action 440 in the process 400 of FIG. 4. These descriptions will not be repeated.

At 660, openings 662 are etched through the piezoelectric plate 642 and the underlying bonding layer 636. The openings 662 may be circular holes or elongated slots or some other shape. As shown in FIG. 6B, the openings 662 are adjacent to the area occupied by the IDT fingers 654. In other embodiments, there may be openings within the area of the IDT fingers. In all cases, the openings 662 are within regions encircled by the lateral etch stops 624, 626.

Referring now to FIG. 6C, at 670, cavities 672 are etched into the device layer 614 using a first liquid or gaseous etchant introduced via the openings 662. The lateral growth of the cavities 672 is constrained by the lateral etch-stops 624, 626. The depth of the cavities 672 is limited by the buried layer 616, which functions as the vertical etch-stop.

Depending on the material and thickness of the bonding layer 636, it may be necessary to remove the bonding layer material from the back side 682 of the diaphragms. To this end, a second liquid or gaseous etchant is introduced via the openings 662. If the lateral etch-stops 624, 626 include the same material as the bonding layer 636, removal of the bonding layer material from the back side 682 of the diaphragms may also remove all or part of the lateral etch-stops. Similarly, when the bonding layer is silicon dioxide, removal of the bonding layer material from the back side 682 of the diaphragms may also remove all or part of the buried oxide layer 616 beneath the cavities.

The filter device is then completed at 690. Actions that may occur at 690 include depositing an encapsulation/passivation layer such as $SiO_2$ or $Si_3O_4$ over all or a portion of the device and/or forming bonding pads or solder bumps or other means for making connection between the device and external circuitry if these steps were not performed at 650. Other actions at 690 may include excising individual devices from a wafer containing multiple devices; other packaging steps; and testing. Another action that may occur at 690 is to tune the resonant frequencies of the resonators within the device by adding or removing metal or dielectric material from the front side of the device. After the filter device is completed, the process ends at 695.

Figure 7A:
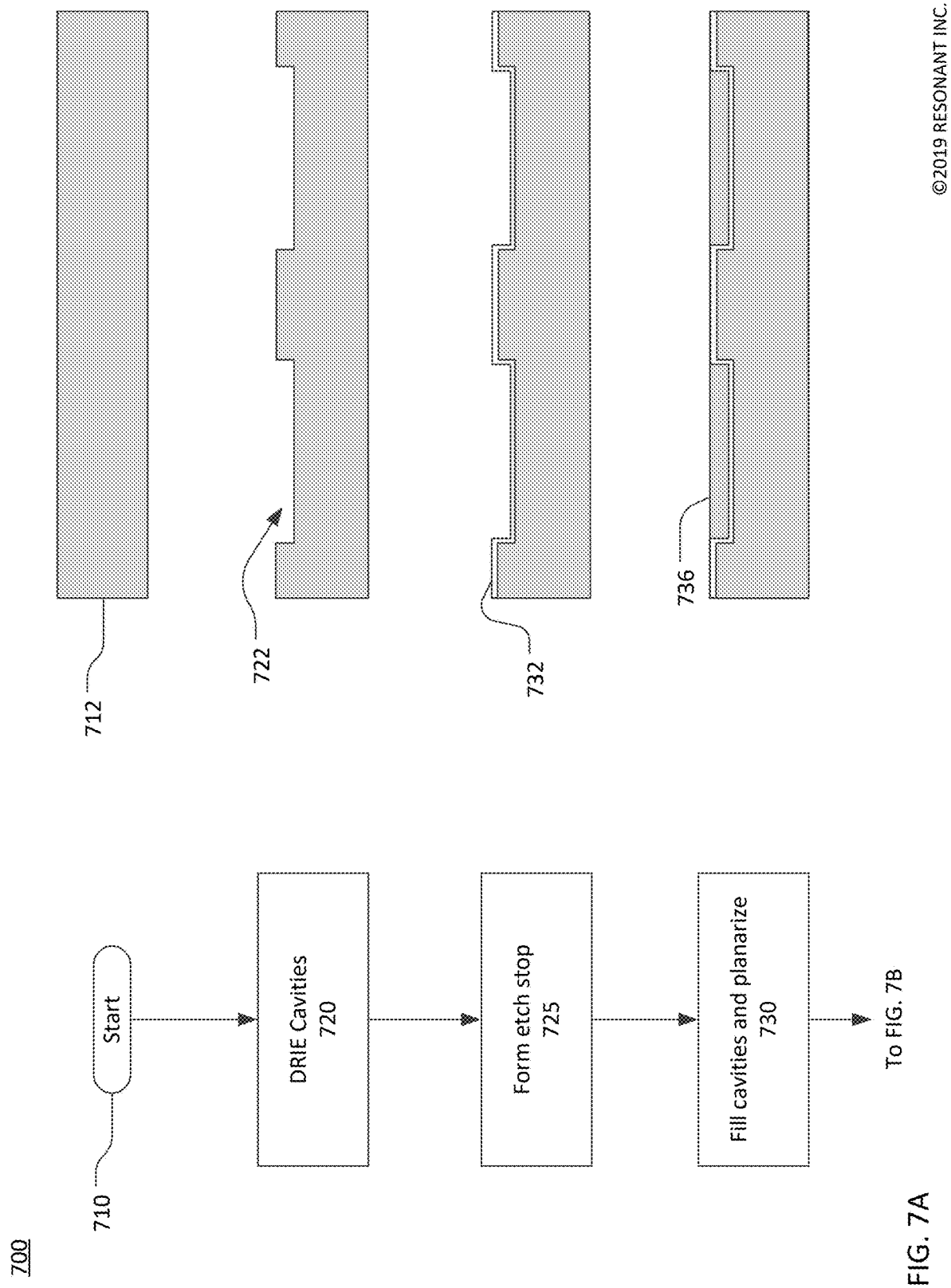
FIG. 7A and FIG. 7B (collectively "FIG. 7") are a flow chart of another process for fabricating an XBAR using a lateral etch stop.
Figure 7B:
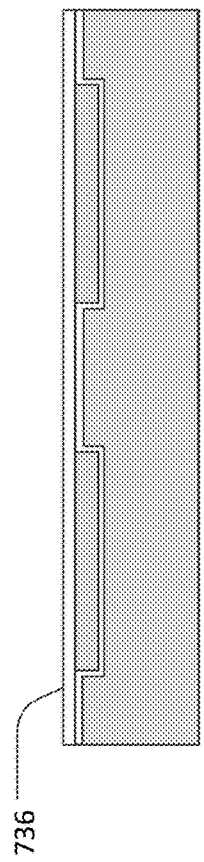
Figure 7B:
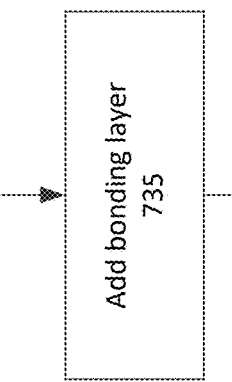

FIG. 7A and FIG. 7B (collectively "FIG. 7") are a simplified flow chart of another process 700 for fabricating an XBAR. The process 700 uses both a lateral etch-stop and a vertical etch-stop (for example, lateral etch-stop 350 and vertical etch-stop 352 in FIG. 3C). To the right of each action in the flow chart is a schematic cross-sectional view representing the end of each action. The later steps of the process 700 are similar to the steps 640-695 of the process 600 of FIG. 6. The description of these steps will not be repeated. Various conventional process steps (e.g. surface preparation, cleaning, inspection, deposition, photolithography, baking, annealing, monitoring, testing, etc.) may be performed before, between, after, and during the steps shown in FIG. 7.

The process 700 starts at 710 in FIG. 7A with a substrate 712 and a plate of piezoelectric material. The substrate 712 may be a silicon wafer or a wafer of another material that allows the formation of deep cavities by etching or some other process. The piezoelectric plate may be mounted on a sacrificial substrate or may be a portion of wafer of piezoelectric material as previously described.

At 720, recesses 722 are formed in the substrate 712 in the locations where the lateral etch stop is desired. While the recesses 722 are only shown in cross-section in FIG. 7A, it must be understood that each recess 722 is a three-dimensional created by removing material from the substrate. Each recess 722 may have a cross-sectional shape (normal to the plane of the drawing) that is a rectangle, a regular or irregular polygon, oval, or some other shape. The recesses 722 may be formed by etching the substrate through a suitable mask such as a photoresist mask or a hard mask. The recesses 722 may be etched into the substrate using a suitable wet or dry etching process. For example, when the substrate is silicon, the recesses may be formed using deep reactive ion etching (DRIE). Other etching processes may be used on other substrate materials.

At 725, lateral and vertical etch-stops 732 are formed by coating the substrate 712, including the bottom and sides of the recesses 722 with one or more etch-stop materials. The etch-stop material or materials may be grown on the substrate and/or deposited onto the substrate using conventional deposition processes such as thermal oxidation, physical vapor deposition, or chemical vapor deposition. The etch-stop material or materials may be any materials that will function to constrain the lateral and vertical growth of the cavity to be formed in the substrate. When the substrate 712 is silicon, suitable etch-stop materials include grown or deposited silicon dioxide, silicon nitride, and aluminum oxide.

At 730, the recesses 722 are filled with a sacrificial material 736. In subsequent process steps, a piezoelectric plate will be bonded to the substrate and the sacrificial material will be removed to form cavities under the piezoelectric plate. The sacrificial material 736 can be any material that can be subsequently be removed by etching, dissolving, or some other process. The etch stop material 722 can be any material that is impervious to the process used to remove the sacrificial material. For example, when the substrate is silicon, the etch-stop material may be silicon dioxide and the sacrificial material may be polysilicon. Other combinations of substrate material, etch-stop material, and sacrificial material may be used.

After the recesses 722 are filled with sacrificial material 736, the surface of the substrate 712 will be uneven and must be planarized. Planarization may be performed by mechanical polishing, by chemo-mechanical polishing, or some other method.

At 730 in FIG. 7B, a bonding layer 736 is formed on the planarized surface of the substrate 712. The bonding layer may silicon dioxide or some material capable of bonding to the piezoelectric material (typically lithium niobate or lithium tantalate) to be used in the XBAR. The bonding layer may be formed by a conventional process such as physical vapor deposition, chemical vapor deposition, or molecular beam epitaxy.

The process 700 then continues at 640 in FIG. 6B. The subsequent steps of the process are as previously described with the exception that, at 670, the cavities are formed by removing the sacrificial material from the recesses in the substrate.

Figure 8A:
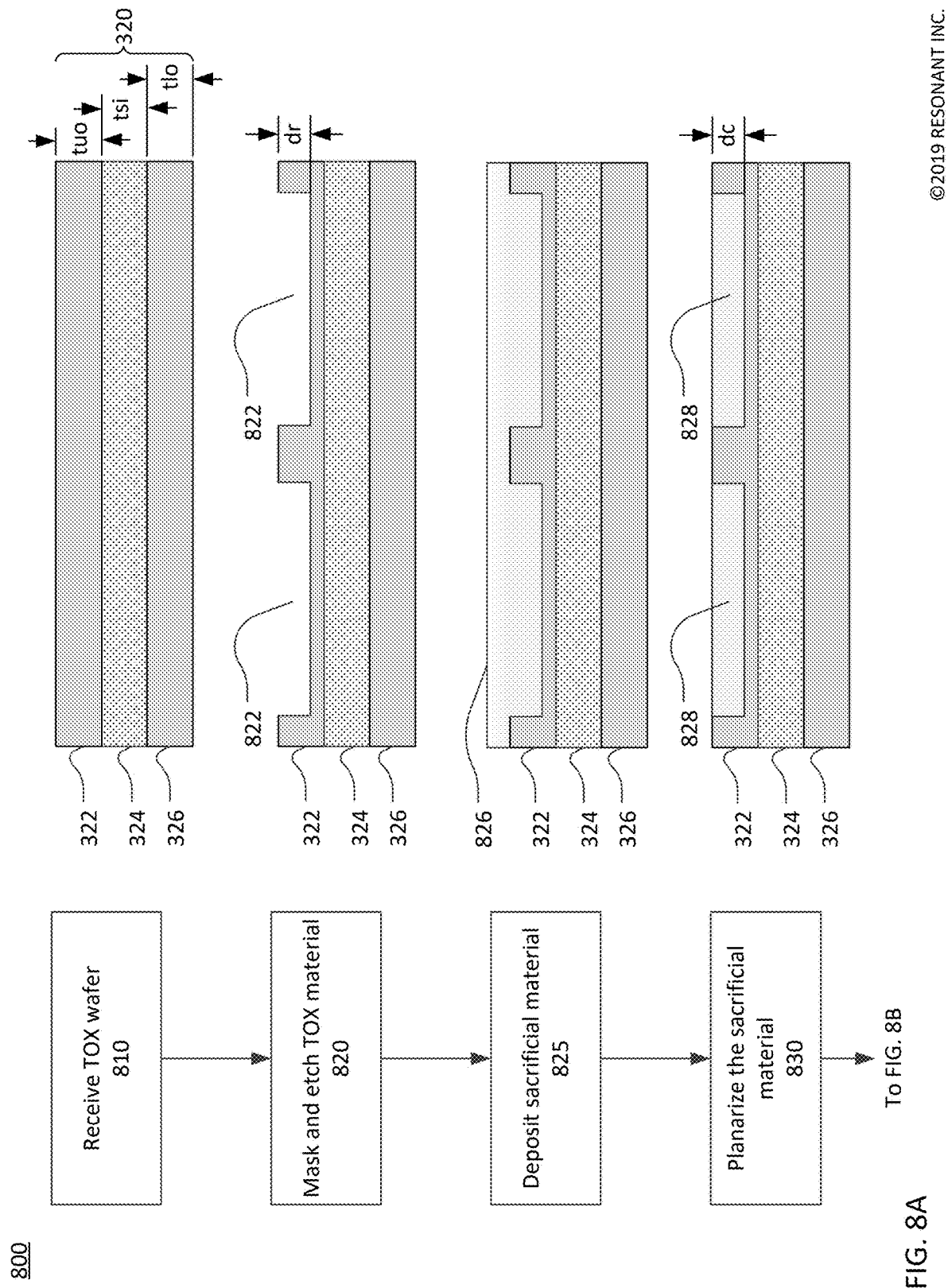
FIG. 8A, FIG. 8B, and FIG. 8C (collectively "FIG. 8") are a flow chart of another process for fabricating an XBAR using a cavity formed by etching a sacrificial layer.
Figure 8B:
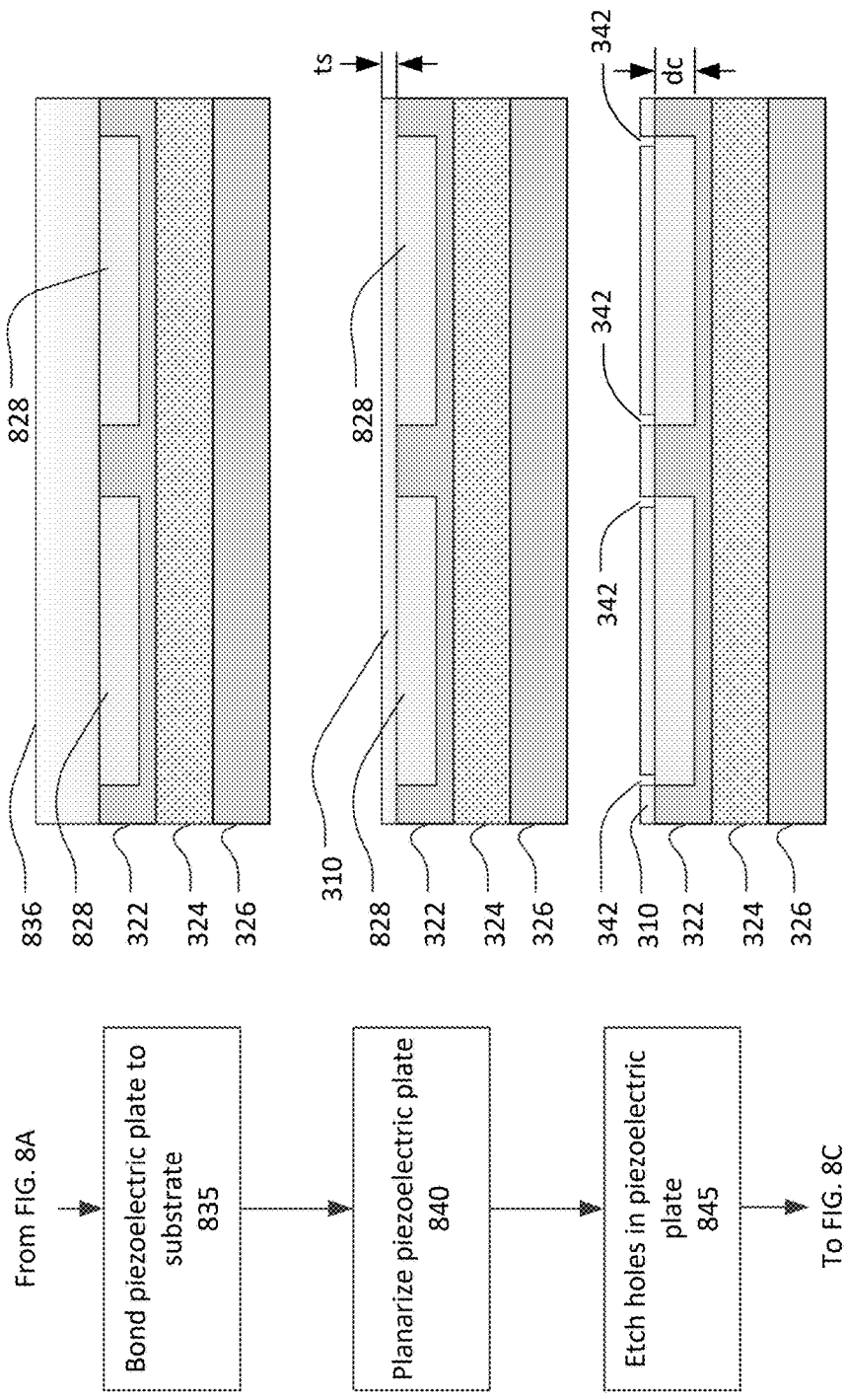
Figure 8C:
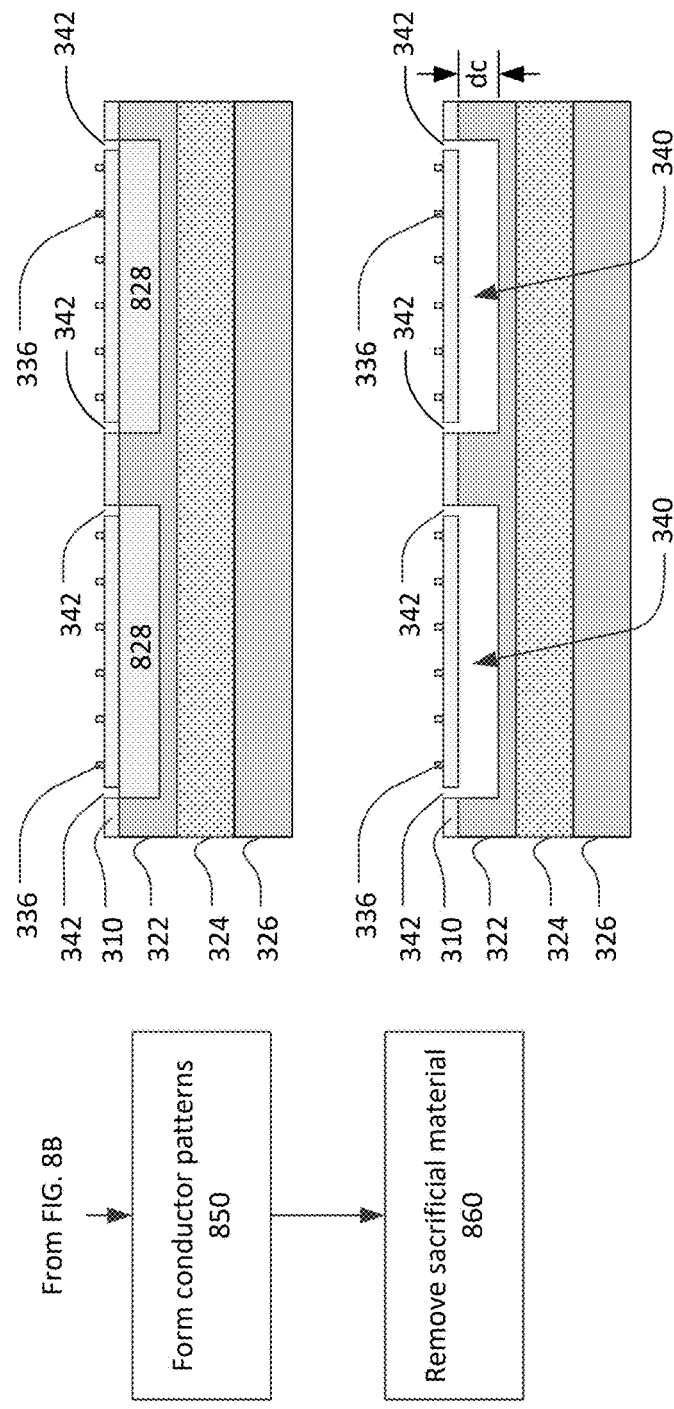

FIG. 8A, FIG. 8B, and FIG. 8C (collectively "FIG. 8") are a flow chart of another process 800 for fabricating an XBAR using a cavity formed by etching a sacrificial layer formed in the substrate. The process uses a predefined etch region or recess 822 in the silicon carrier wafer prior to bonding to the active piezoelectric (LiNbO3 or other) plate. The pre-defined region filled with a sacrificial material (e.g., dummy poly Si) defines the size and boundaries of the cavity when etched from the front side through the plate. Process 800 may fabricate an XBAR by front side etching a cavity 340 under plate 310 using a subtractive or dry etching process that provides good control of substrate sidewall and bottom surface locations and angles for the cavity formed under the IDT. The process 800 is or is included in the forming of XBAR 300D, 300E and/or 300F as shown in FIGS. 3D-F.

To the right of each action in the flow chart is a schematic cross-sectional view representing the end of each action. The relationship between steps of the process 700 and steps of the process 400 of FIG. 4 are noted below. Various conventional process steps (e.g. surface preparation, cleaning, inspection, deposition, photolithography, baking, annealing, monitoring, testing, etc.) may be performed before, between, after, and during the steps shown in FIG. 8.

The process 800 starts at 810 with a substrate 320 such as a silicon TOX carrier wafer. The wafer has upper layer 322 of silicon TOX attached to middle layer 324 of polycrystalline silicon which is attacked to lower layer 326 silicon of TOX. Prior to 810, the substrate 320 may be received such as by being obtained or purchased from an outside source. The thicknesses of the upper layer 322, middle layer 324 and lower layer 326 are thicknesses tuo, tsi and tlo respectively. Each of these thicknesses may be between 0.5 and 2 μm thick. In some cases, thicknesses tuo and tlo are 1 μm thick; and thickness tsi is 2 μm thick. Thickness tsi may be greater than those of tuo and tlo.

In some cases, the substrate 320 is a wafer of other than or not only silicon material that has the TOX upper and lower layers; and that allows the formation of deep cavities by etching or some other process.

At 820, recesses 822 are formed in the substrate 712 in the locations where the cavity 340 is desired. The recesses may be cavity openings in the material of layer 322. While the recesses 822 are only shown in cross-section in FIG. 8, it must be understood that each recess 822 is a three-dimensional created by removing material from the substrate. Each recess 822 may have a cross-sectional shape (normal to the plane of the drawing) that is a rectangle, a regular or irregular polygon, oval, or some other shape. The recesses 822 may be formed by etching the substrate through a suitable mask such as a photoresist mask or a hard mask. The recesses 822 may be etched into the substrate using a suitable wet or dry etching process. For example, when the substrate is silicon, the recesses may be formed using deep reactive ion etching (DRIE). Another exemplary etch could be etching in an inductively coupled plasma (ICP) chamber or using an ion mill. Other etching processes may be used on other substrate materials.

Forming recesses 822 may be masking and etching a top surface of upper layer 322 of silicon TOX to form recesses that leave some TOX material underneath them. The recesses 822 may have a depth of dr of between 1 and 10 μm thick. In some cases, dr is approximately 0.8 μm deep. The thickness of material under the recesses (not shown) may be between 0.2 and 0.4 μm thick. In some cases, the recesses 822 may have a length similar to length Lc of cavity 340; and width similar to width We of cavity 340. Recesses 822 may be predefined etch regions in the silicon carrier wafer prior to bonding the wafer to an active piezoelectric (e.g., LiNbO3 or other material) wafer or plate (e.g., at 835).

At 825, the recesses 822 are filled with a sacrificial material 826. In subsequent process steps, a piezoelectric plate 310 will be bonded to the substrate and the sacrificial material 826 will be removed to form cavities 340 under the piezoelectric plate. The sacrificial material 826 can be any material that can be subsequently removed by selectively etching, dissolving, or some other process that removes material 826 with respect to the material of layer 322. The process will remove all or substantially all of material 826 without removing any or barely any of the material of layer 322. Filling the openings may be described as backfilling them with dummy polysilicon.

Recesses 822 can be pre-defined regions in a silicon TOX layer 322 that are filled with a dummy layer of polycrystalline silicon 826 to constrain or limit the size of the resonator plate membranes when material 826 is etched from the front side through openings 342 and optionally openings 344. In some cases, layer 322 can be any material that is impervious to the process used to remove the sacrificial material 826. For example, when layer 322 is silicon TOX such as silicon dioxide, the sacrificial material may be polysilicon. Other combinations of substrate material and sacrificial material may be used.

At 830, the sacrificial material 826 is planarized to expose the TOX material. For example, after the recesses 822 are filled with sacrificial material 826, the surface of the substrate 320 will be uneven and must be planarized. Planarization may be performed by mechanical polishing, by chemical-mechanical polishing (CMP), or some other method. In some cases, planarizing at 830 is CMP the material 826 until the top surface of material of layer 322 is exposed. The surface of layer 322 may stop removal of the sacrificial layer by the polishing because it is polished magnitudes slower by the CMP process than that of material 826. In some cases, at 830, CMP of polysilicon material 826 is performed to expose TOX and to polish off some (e.g., less than 10 percent) of the thickness of layer 322. Planarizing at 830 may be described as performing CMP to flatten the surface of material 826. After planarizing, thickness dc of sacrificial material remains. A vertical extent dc of the cavity 340 formed at 860 may be defined by the recess depth dr minus the planarizing depth below the top surface of the silicon TOX layer.

Thickness dr is greater than or the same as cavity depth dc. Thicknesses tuo may be between 10 and 50 microns; depth dc may be between 1 and 10 microns; and thickness tuo is greater than depth dc.

At 835, the piezoelectric plate 836 is bonded to the substrate 320. The piezoelectric plate 836 and the substrate top layer 322 may be bonded by a wafer bonding process. The bonding at 835 may be as noted for bonding the piezoelectric plate to the substrate at 420, including the options of the first or second variation.

At 840 the piezoelectric plate 836 is planarized to form piezoelectric plate 310. Planarizing at 840 may include thinning the plate 936 by ion slicing, CMP or some other method to polish the plate to a desired thickness is of plate 310.

At 845 one or more openings 342 are etched through to piezoelectric plate and to sacrificial material 828. Etching the openings at 845 may be forming openings 342 adjacent to the area that is selected to be occupied by the IDT fingers 336 as shown in FIG. 3D and/or openings 344 within the area that is selected for the IDT fingers 336. Etching the openings at 845 may also include etching through the plate along dicing streets for separating from each other, resonators or chips having resonators.

At 850, conductor patterns are formed on the top surface of the piezoelectric plate 310. Forming the conductor patterns at 850 may be the same as forming conductor patterns and dielectric layers defining one or more XBAR devices on the surface of the piezoelectric plate at 430. It includes forming fingers 336. It may include forming dielectric layers, etch stop layers and/or passivation layers on the front side of the piezoelectric plate.

At 860 the sacrificial material 828 is removed to form cavities 340. Removing the material at 860 may be dry etching away material 828 through openings 342 and/or 344 in the plate. The cavities 860 may be etched by an etch process that etches away all or substantially all of the sacrificial material 828 but does not remove any or substantially any of the material of layer 322. Removing sacrificial material 828 to form cavities 340 may be performed by selectively etching, dissolving, or some other process that removes material 828 with respect to the material of layer 322. Removing at 850 may be a dummy poly 828 removal by a dry etch that is an isotropic etch.

Process 800 may end at 860 with a completed XBAR conductor pattern formed on a released membrane of piezoelectric material plate 310 over each of the cavities 340. The completed XBAR conductor pattern on the plate at 310 may be a conductor pattern that is or that includes the IDT patterns and/or fingers described herein for XBAR devices.

Selecting polysilicon as the sacrificial layer 826/828 is of significant benefit in terms of etch selectivity, in that etch chemistry that is selective to polysilicon over silicon TOX (e.g., SiO2) of layer 322 is much more common than, for example, than an etch chemistry that is selective phosphosilicate glass (PSG) over SiO2. Using the polysilicon as sacrificial layer 826/828 provides better control of forming the cavity and selection of a predetermined area size and depth for the cavity. It also allows forming of a smaller cavity than other processes such as those for FIG. 3A. For example, by using polysilicon as the sacrificial layer and silicon TOX as layer 322, a wet etch chemistry (or process) that can etch the silicon TOX layer is not required to form the cavities 340 and/or release the resonator membrane. Some other approaches for 'frontside' etching of resonator cavities require membranes that are much larger than the desired size. Using a predefined area for recess 822 at 820 that is filled with a sacrificial material (e.g., polysilicon) 826/828 at 825, allows the resonator membrane size over the cavities 340 to be drastically reduced, and fabrication steps to be significantly simplified.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A method for fabricating an acoustic resonator, comprising:
    forming a substrate that includes a silicon thermal oxide (TOX) upper layer on a middle layer of polycrystalline silicon that is bonded to a silicon TOX lower layer opposite the silicon TOX upper layer;
    etching a recess in the silicon TOX upper layer of the substrate;
    filling the recess with sacrificial polysilicon, which is a material capable of being etched by an etching process;
    planarizing a surface of the silicon TOX upper layer and the sacrificial polysilicon-filled recess;
    bonding a back surface of a piezoelectric layer to the planarized surface of the silicon TOX upper layer;
    forming one or more openings through the piezoelectric layer;
    forming an interdigital transducer (IDT) on the piezoelectric layer such that interleaved fingers of the IDT are disposed over the sacrificial polysilicon-filled recess; and
    removing the sacrificial polysilicon from the recess by the etching process to form a cavity such that a portion of the piezoelectric layer forms a diaphragm over the cavity and the interleaved fingers of the IDT are disposed on the diaphragm,
    wherein the silicon TOX upper layer comprises a material that is substantially impervious to the etching process.

2. The method of claim 1, wherein the etching process for removing the sacrificial polysilicon from the recess includes etching the sacrificial polysilicon using an etchant introduced through the openings, and wherein a lateral extent of the cavity is defined by the recess.

3. The method of claim 2, wherein the etching process for removing the sacrificial polysilicon from the recess comprises selectively etching the sacrificial polysilicon with respect to the silicon TOX upper layer using a dry etch.

4. The method of claim 1, wherein a vertical extent of the cavity is defined by the recess and the planarizing of the surface of the silicon TOX upper layer.

5. The method of claim 1, wherein bonding the back surface of the piezoelectric layer to the planarized surface of the silicon TOX upper layer includes planarizing a top surface of the piezoelectric layer.

6. The method of claim 1, wherein:
    the piezoelectric layer and the IDT are configured such that a radio frequency signal applied to the IDT excites a primary shear acoustic mode in the diaphragm; and
    a direction of acoustic energy flow of the shear primary acoustic wave is substantially orthogonal to opposing front and back surfaces of the piezoelectric layer.

7. The method of claim 1, wherein the piezoelectric layer is one of lithium niobate and lithium tantalate.

8. A method for fabricating an acoustic resonator, comprising:
    forming a substrate that includes a silicon thermal oxide (TOX) upper layer on a middle layer of polycrystalline silicon that is bonded to a silicon TOX lower layer opposite the silicon TOX upper layer;
    etching at least two recesses in the silicon TOX upper layer of the substrate;
    filling the at least two recesses with sacrificial polysilicon, which is a material capable of being etched by an etching process;
    planarizing a surface of the silicon TOX upper layer and the sacrificial polysilicon-filled at least two recesses;
    bonding a back surface of a piezoelectric layer to the planarized surface of the silicon TOX upper layer;
    forming one or more openings through the piezoelectric layer over each of the sacrificial polysilicon-filled at least two recess;
    forming at least two interdigital transducers (IDTs) on the piezoelectric layer such that interleaved fingers of the IDTs are disposed over each of the sacrificial polysilicon-filled at least two recess; and
    removing the sacrificial polysilicon from the at least two recesses by the etching process to form at least two cavities such that a portion of the piezoelectric layer forms diaphragms over each of the at least two cavities and the interleaved fingers of the IDT are disposed on the diaphragms,
    wherein the silicon TOX upper layer comprises a material that is substantially impervious to the etching process.

9. The method of claim 8, wherein the etching process for removing the sacrificial polysilicon from the recesses includes etching the sacrificial polysilicon using an etchant introduced through the openings, and wherein a lateral extent of the cavities is defined by the at least two recesses.

10. The method of claim 9, wherein the etching process for removing the sacrificial polysilicon from the at least two recesses comprises selectively etching the sacrificial polysilicon with respect to the silicon TOX upper layer using a dry etch.

11. The method of claim 8, wherein a vertical extent of the at least two cavities is defined by the at least two recesses and the planarizing of the surface of the silicon TOX upper layer.

12. The method of claim 8, wherein bonding the back surface of the piezoelectric layer to the planarized surface of the silicon TOX upper layer includes planarizing a top surface of the piezoelectric layer.

13. The method of claim 8, wherein:
    the piezoelectric layer and the IDTs are configured such that a radio frequency signal applied to the IDTs excites a primary shear acoustic mode in the diaphragms; and
    a direction of acoustic energy flow of the shear primary acoustic wave is substantially orthogonal to opposing front and back surfaces of the piezoelectric layer.

14. The method of claim 8, wherein the piezoelectric layer is one of lithium niobate and lithium tantalate.

15. The method of claim 8, wherein etching the recesses in the silicon TOX upper layer includes etching through the piezoelectric layer to form at least two portions of the piezoelectric layer that form the diaphragms over each of the at least two cavities.

* * * * *